(12) United States Patent
Kim et al.

(10) Patent No.: US 12,513,823 B2
(45) Date of Patent: Dec. 30, 2025

(54) ELECTRONIC DEVICE INCLUDING FLEXIBLE PRINTED CIRCUIT BOARD

(71) Applicant: SAMSUNG ELECTRONICS CO., LTD., Suwon-si (KR)

(72) Inventors: Yongyoun Kim, Suwon-si (KR); Seyoon Bae, Suwon-si (KR); Joon Heo, Suwon-si (KR); Sangkyun Lee, Suwon-si (KR); Minsu Jung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 113 days.

(21) Appl. No.: 18/346,880

(22) Filed: Jul. 5, 2023

(65) Prior Publication Data

US 2023/0354524 A1 Nov. 2, 2023

Related U.S. Application Data

(63) Continuation of application No. PCT/KR2022/014865, filed on Oct. 4, 2022.

(30) Foreign Application Priority Data

Oct. 6, 2021 (KR) .................. 10-2021-0132569
Dec. 17, 2021 (KR) .................. 10-2021-0181826

(51) Int. Cl.
*H05K 1/14* (2006.01)
*H05K 1/02* (2006.01)
*H05K 5/02* (2006.01)

(52) U.S. Cl.
CPC ........... *H05K 1/148* (2013.01); *H05K 1/0281* (2013.01); *H05K 5/0226* (2013.01); *H05K 2201/10128* (2013.01)

(58) Field of Classification Search
CPC .... H05K 1/148; H05K 1/0281; H05K 5/0226; H05K 2201/10128
(Continued)

(56) References Cited

U.S. PATENT DOCUMENTS 10,503,121 B2* 12/2019 Matsunaga ........ G04B 37/1486
10,736,211 B2 8/2020 Park et al.
(Continued)

FOREIGN PATENT DOCUMENTS

CN 213847328 U 7/2021
CN 112134970 B 8/2021
(Continued)

OTHER PUBLICATIONS

The extended European search report for EP Application No. 22878839.4 mailed on Oct. 28, 2024.
(Continued)

*Primary Examiner* — Andargie M Aychillhum
(74) *Attorney, Agent, or Firm* — CANTOR COLBURN LLP

(57) ABSTRACT

An electronic device includes: a hinge structure which is a folding area and includes a hinge housing; a first housing connected to the hinge structure; a second housing connected with the first housing through the hinge structure to be rotatable with respect to the first housing; and a flexible printed circuit board (FPCB), which has one end connected to a first printed circuit board (PCB) disposed in the first housing, and the other end connected to a second PCB disposed in the second housing. The FPCB includes a first section and a second section, the second section is extended from one side of the first section, and a variance in a curvature of the second section is greater than a variance in a curvature of the first section when the first housing and the second housing rotate with respect to the hinge structure.

20 Claims, 16 Drawing Sheets

(58) Field of Classification Search
USPC .......................................................... 361/749
See application file for complete search history.

(56) References Cited

U.S. PATENT DOCUMENTS

| | | | |
|---|---|---|---|
| 10,827,633 B2 | 11/2020 | Yoo et al. | |
| 11,178,779 B2 | 11/2021 | Sim et al. | |
| 11,204,628 B2 | 12/2021 | Paek et al. | |
| 12,204,288 B2* | 1/2025 | Hata | G04G 17/06 |
| 2014/0240985 A1* | 8/2014 | Kim | H10K 77/111 |
| | | | 438/34 |
| 2016/0037625 A1* | 2/2016 | Huitema | G09F 21/02 |
| | | | 361/749 |
| 2021/0251081 A1 | 8/2021 | Kimura et al. | |
| 2021/0263558 A1 | 8/2021 | Bie et al. | |
| 2022/0129046 A1 | 4/2022 | Baek et al. | |

FOREIGN PATENT DOCUMENTS

| | | | | |
|---|---|---|---|---|
| EP | 3734945 A1 * | 11/2020 | ........... | G06F 1/1616 |
| JP | 2021124686 A | 8/2021 | | |
| KR | 102323593 | * | 7/2014 | |
| KR | 20180122210 A | 11/2018 | | |
| KR | 20200021172 A | 2/2020 | | |
| KR | 20200082363 A | 7/2020 | | |
| KR | 20200100490 A | 8/2020 | | |
| KR | 20200127617 A | 11/2020 | | |
| KR | 20210019095 A | 2/2021 | | |
| KR | 20210050040 A | 5/2021 | | |
| KR | 20230040174 A | 3/2023 | | |

OTHER PUBLICATIONS

International Search Report mailed Jan. 20, 2023 for PCT/KR2022/014865.
Indian Office Action for IN Application No. 202447034252 mailed on Oct. 17, 2025.
European Office Action for EP Application No. 22878839.4 mailed on Oct. 2, 2025.

* cited by examiner

ELECTRONIC DEVICE INCLUDING FLEXIBLE PRINTED CIRCUIT BOARD

CROSS-REFERENCE TO RELATED APPLICATION(S)

This application is a national stage of International Application No. PCT/KR2022/014865 designating the United States, filed on Oct. 4, 2022, in the Korean Intellectual Property Receiving Office and claiming priority to Korean Patent Application No. 10-2021-0132569, filed on Oct. 6, 2021 and Korean Patent Application No. 10-2021-0181826, filed on Dec. 17, 2021, in the Korean Intellectual Property Office, the disclosures of which are incorporated by reference herein in their entireties.

BACKGROUND

1. Field

Various embodiments disclosed in the disclosure relate to an electronic device including a flexible printed circuit board.

2. Description of Related Art

A mobile electronic device such as a smartphone may provide various functions, such as calling, playing videos, Internet search, etc., based on various kinds of applications. A user may wish to use the above-described functions through a larger screen, but portability of an electronic device may be degraded as the size thereof increases. Accordingly, a foldable electronic device which enhances portability by utilizing a folding structure may be provided. For example, the foldable electronic device may include a hinge structure, and a first housing and a second housing which are connected with each other by the hinge structure to be connected in opposite directions to be rotatable.

The foldable electronic device may include a printed circuit board which connects electronic components disposed on the housings separated with reference to the hinge structure, respectively. The printed circuit board may include a flexible printed circuit board which has some areas bendable when the foldable electronic device is folded or unfolded.

SUMMARY

As electronic devices become slimmer, a height of a hinge housing in which at least part of a flexible printed circuit board is disposed may be reduced. As the height of the hinge housing is reduced, a space for accommodating the flexible printed circuit board may be reduced, and a variance in the curvature of a bending area of the flexible printed circuit board may increase. As the variance in the curvature increases, a stress generated in the bending area by the bending of the flexible printed circuit board may increase. For example, if some areas of the flexible printed circuit board have a narrow width than their adjacent areas, the narrow area may be relatively easily broken by a force applied from the outside.

According to various embodiments of the disclosure, an electronic device includes: a hinge structure which is a folding area and includes a hinge housing; a first housing connected to the hinge structure; a second housing connected with the first housing through the hinge structure to be rotatable with respect to the first housing; and a flexible printed circuit board (FPCB), which has a first end connected to a first printed circuit board (PCB) disposed in the first housing, and a second end connected to a second PCB disposed in the second housing. The FPCB includes a first section and a second section, the second section is extended from a first side of the first section, and a variance in a curvature of the second section may be greater than a variance in a curvature of the first section when the first housing and the second housing rotate with respect to the hinge structure.

According to various embodiments of the disclosure, an electronic device includes: a hinge structure which is a folding area and includes a hinge housing; a first housing connected to the hinge structure; a second housing connected with the first housing through the hinge structure to be rotatable with respect to the first housing; and an FPCB which has a first end connected to a first PCB disposed in the first housing, and a second end connected to a second PCB disposed in the second housing. The FPCB includes: a first section including a curvature when the first housing and the second housing are folded or unfolded through the hinge structure; and a second section which is extended from a first side of the first section, and is disposed to form a linear area at least part of which has a flat surface in the folded state of the first housing and the second housing, and to form a curvature in the unfolded state, and a variance in a curvature of the second section may be greater than a variance in a curvature of the first section when the first housing and the second housing rotate with respect to the hinge structure.

According to various embodiments of the disclosure, an electronic device includes: a hinge structure which is a folding area and includes a hinge housing; a first housing connected to the hinge structure; a second housing connected with the first housing through the hinge structure to be rotatable with respect to the first housing; and an FPCB, which has a first end connected to a first PCB disposed in the first housing, and a second end connected to a second PCB disposed in the second housing. The FPCB includes a first section, a second section, and a third section, the second section is extended from one side of the first section, and the third section is extended from one side of the second section, and a variance in a curvature of the first section may be greater than a variance in a curvature of at least one of the second section or the third section when the first housing and the second housing rotate with respect to the hinge structure.

Various embodiments of the disclosure provide an electronic device including a flexible printed circuit board, which may effectively prevent the flexible printed circuit board from being damaged, by reducing a change in a curvature of a bent area of the flexible printed circuit board caused by bending of the flexible printed circuit board.

In addition, various embodiments of the disclosure provide an electronic device which has durability of a flexible printed circuit board enhanced without including an additional stiffener.

In addition, various effects that are directly or indirectly grasped through the disclosure may be provided.

BRIEF DESCRIPTION OF THE DRAWINGS

Regarding explanation of the drawings, the same or similar reference numerals may be used for the same or similar components.

DETAILED DESCRIPTION

Figure 1:
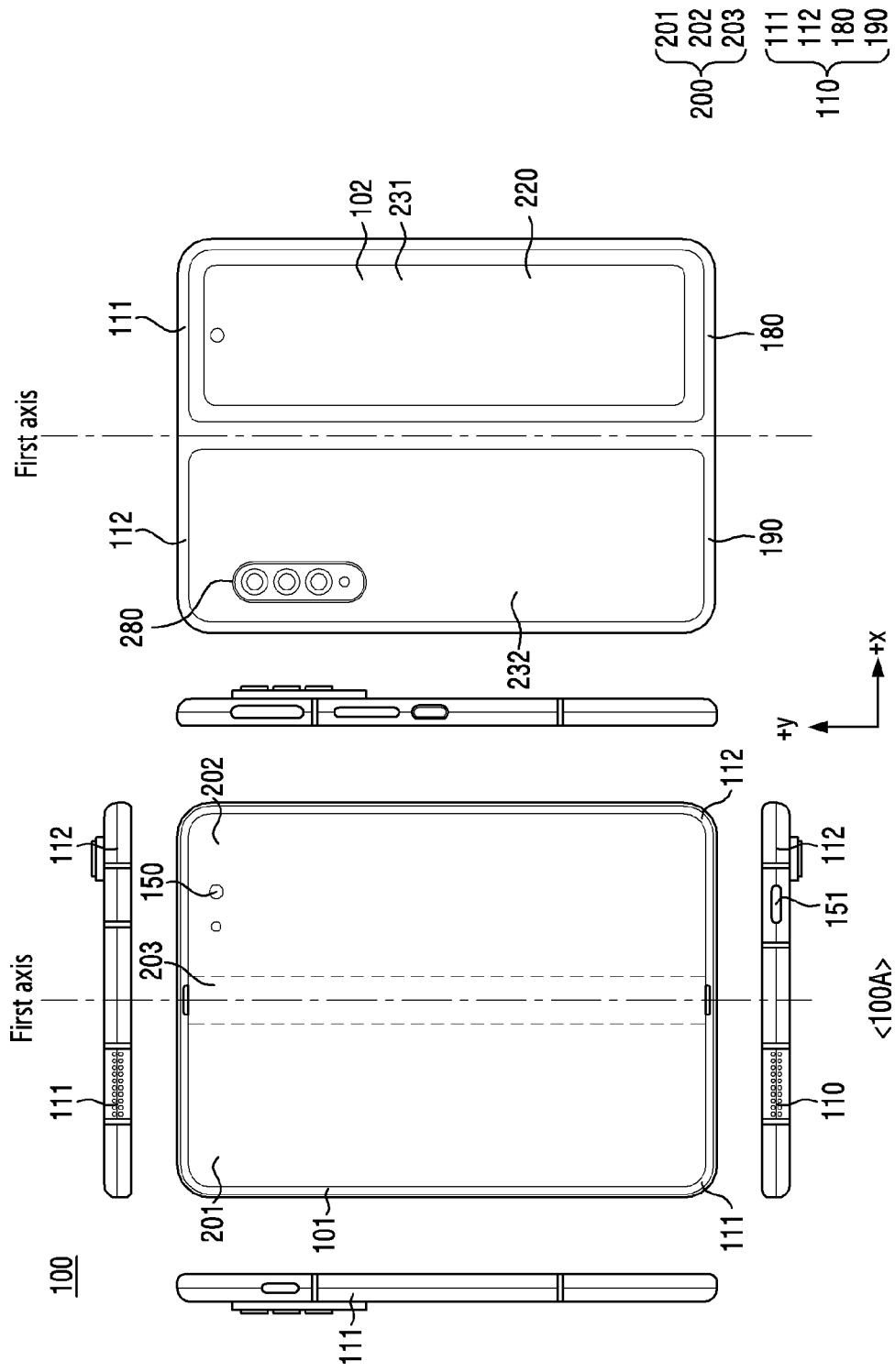
FIG. 1 is a view illustrating a flat state of an electronic device according to an embodiment.

Various embodiments of the disclosure will be described herein below with reference to the accompanying drawings. However, these are not intended to limit the disclosure to specific embodiments, and should be understood as including various modifications, equivalents, and/or alternatives of embodiments of the disclosure.

An electronic device according to various embodiments of the disclosure may include at least one of, for example, smartphones, tablet personal computers (PCs), mobile phones, video telephones, electronic book readers, desktop PCs, laptop PCs, netbook computers, workstations, servers, personal digital assistant (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable devices may include at least one of accessories (for example, watches, rings, bracelets, ankle bracelets, necklaces, glasses, contact lenses, head-mounted-devices (HMDs), etc.), fabric- or clothing-mounted devices (for example, electronic apparels), body-mounted devices (for example, skin pads, tattoos, etc.), or bio-implantable circuits.

According to some embodiments, the electronic device may be a home appliance. The home appliance may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes, game consoles, electronic dictionaries, electronic keys, camcorders, or electronic picture frames.

According to another embodiment, the electronic device may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, global navigation satellite systems (GNSS), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or Internet of things (for example, light bulbs, various sensors, electricity or gas meters, sprinkler devices, fire alarms, thermostats, street lamps, toasters, exercise equipment, hot water tanks, heaters, boilers, or the like).

According to an embodiment, the electronic device may include at least one of furniture, a part of buildings/structures, electronic boards, electronic signature receiving devices, projectors, or various measuring instruments (for example, water meters, electricity meters, gas meters, or wave meters). In various embodiments, the electronic device may be one or a combination of two or more devices of the above-mentioned devices. According to a certain embodiment, the electronic device may be a flexible electronic device. Also, the electronic device according to various embodiments of the disclosure is not limited to the above-mentioned devices, and may include new electronic devices according to technology development.

Figure 2:
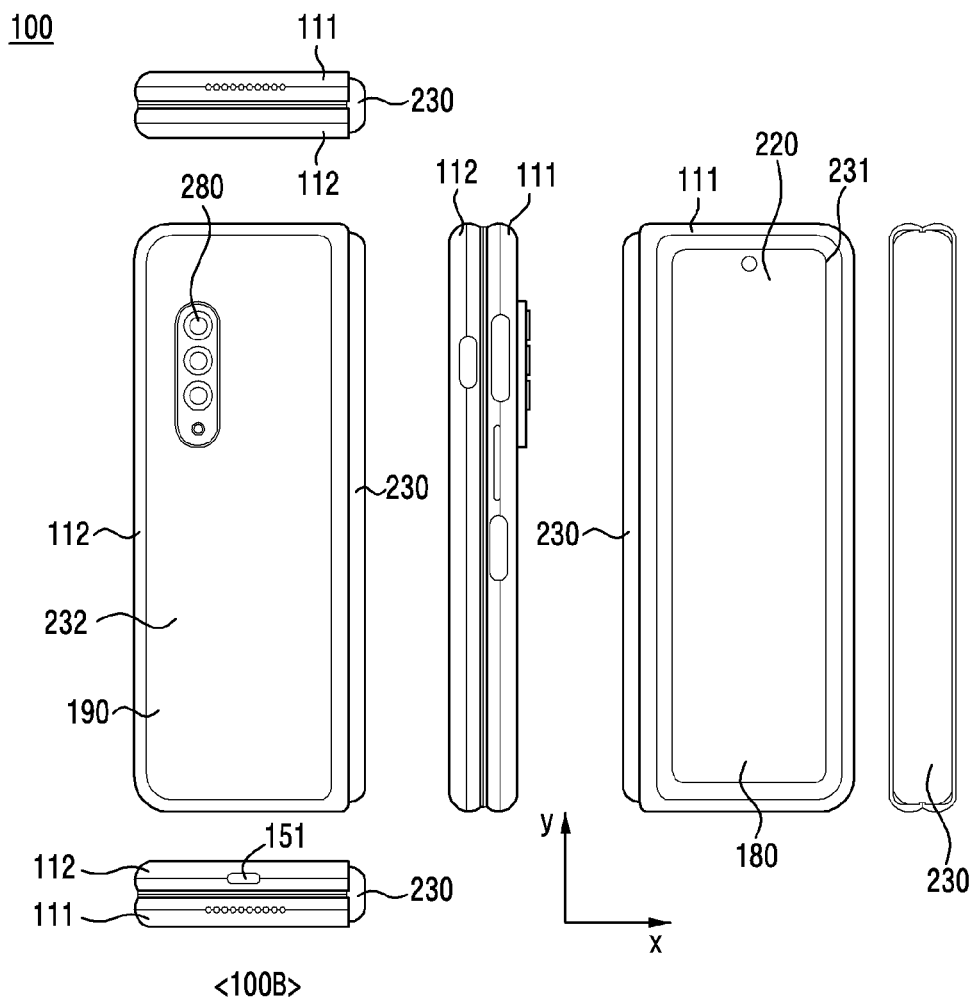
FIG. 2 is a view illustrating a folded state of the electronic device according to an embodiment.

FIG. 1 is a view illustrating a first state (flat state) 100A of an electronic device according to an embodiment. FIG. 2 is a view illustrating a second state (folded state) 100B of the electronic device according to an embodiment. Referring to FIGS. 1 and 2, in an embodiment, the electronic device 100 may include a housing 110, a hinge cover 230 to cover a foldable portion of the housing 110, and a flexible or foldable display 200 (hereinafter, referred to as a "main display" 200) disposed in a space formed by the housing 110. In the disclosure, a surface on which the main display 200 is disposed is defined as a first surface or a front surface 101 of the electronic device 100. In addition, the opposite surface of the front surface 101 is defined as a second surface or a rear surface 102 of the electronic device 100. In addition, a surface surrounding a space between the front surface 101 and the rear surface 102 is defined as a third surface or a side surface 103 of the electronic device 100.

According to an embodiment, the housing 110 may include a foldable housing. In an embodiment, the housing 110 may include a first housing 111, a second housing 112, a first rear surface cover 180, and a second rear surface cover 190. The housing 110 of the electronic device 100 is not limited to the shape and coupling illustrated in FIGS. 1 and 2, and may be implemented by a combination and/or coupling of other shapes or components. For example, in another embodiment, the first housing 111 and the first rear surface cover 180 may be integrally formed with each other, and the second housing 112 and the second rear surface cover 190 may be integrally formed with each other.

According to an embodiment, a state in which the electronic device 100 is unfolded may refer to the flat state 100A or the first state 100A. For example, a state in which the first housing 111 and the second housing 112 are unfolded may correspond to the flat state 100A or the first state 100A. In addition, a state in which the electronic device 100 is folded may refer to the folded state 100B or the second state 100B. For example, a state in which the second housing 112 rotates with respect to the first housing 111 and is folded may correspond to the folded state 100B or the second state 100B.

According to an embodiment, the first housing 111 and the second housing 112 may have an angle or a distance therebetween that is changed according to whether the electronic device 100 is in a flat state, a folded state, or an intermediate state.

In the illustrated embodiment, the first housing 111 and the second housing 112 may be disposed on both sides with reference to a folding axis (hereinafter, a "first axis"), and may have a substantially symmetrical shape with respect to the first axis. However, the first housing 111 and the second housing 112 may have an asymmetrical shape in some areas. For example, the second housing 112 may further include a USB hole 151, differently from the first housing 111. In other words, the first housing 111 and the second housing 112 may include portions that have a symmetrical shape and portions that have an asymmetrical shape.

According to an embodiment, the main display 200 may be symmetrically disposed over the first housing 111 and the second housing 112.

In an embodiment, at least part of the first housing 111 and the second housing 112 may be formed with a metallic material or a nonmetallic material having stiffness of a level selected to support the main display 200.

In an embodiment, the first rear surface cover 180 may be disposed on one side of the first axis on the rear surface of the electronic device. For example, the first rear surface cover 180 may have a substantially rectangular periphery, and may have the periphery surrounded by the first housing 111. Similarly, the second rear surface cover 190 may be disposed on the other side of the first axis on the rear surface of the electronic device, and may have the periphery surrounded by the second housing 112.

In the illustrated embodiment, the first rear surface cover 180 and the second rear surface cover 190 may have a substantially symmetrical shape with reference to the first axis. However, the first rear surface cover 180 and the second rear surface cover 190 may not necessarily have the symmetrical shape, and in another embodiment, the electronic device 100 may include the first rear surface cover 180 and the second rear surface cover 190 of various shapes.

In an embodiment, the first rear surface cover 180, the second rear surface cover 190, the first housing 111, and the second housing 112 may form a space to have various components (for example, a printed circuit board or a battery) of the electronic device 100 disposed therein. In an embodiment, one or more components may be disposed on the rear surface of the electronic device 100 or may be visually exposed. For example, at least part of a sub display 220 may be visually exposed through a first rear surface area 181 of the first rear surface cover 180. In another embodiment, the sub display 220 may be disposed on the entirety of the first rear surface area 231 of the first rear surface cover 180.

In another embodiment, one or more components or a sensor may be visually exposed through a second rear surface area 232 of the second rear surface cover 190. In various embodiments, the sensor may include a proximity sensor and/or a rear-facing camera 280.

The main display 200 may be disposed on the space formed by the housing 110. For example, the main display 200 may be seated on a recess formed by the housing 110, and may form most of the front surface 101 of the electronic device 100.

Accordingly, the front surface 101 of the electronic device 100 may include the main display 200, and some areas of the first housing 111 and some areas of the second housing 112 which are adjacent to the main display 200. In addition, the rear surface 102 of the electronic device 100 may include the first rear surface cover 180, some areas of the first housing 111 that are adjacent to the first rear surface cover 180, the second rear surface cover 190, and some areas of the second housing 112 that are adjacent to the second rear surface cover 190.

The main display 200 may refer to a display that has at least some areas deformable to a flat surface or a curved surface. In an embodiment, the main display 200 may include a folding area 203, a first display area 201 disposed on one side (the left of the folding area 203 show in FIG. 1) with reference to the folding area 203, and a second display area 202 disposed on the other side (the right of the folding area 203 shown in FIG. 1).

The divided areas of the main display 200 shown in FIG. 1 are examples and the main display 200 may be divided into a plurality of areas (for example, four or more areas or two areas) according to a structure or a function of the main display 200. For example, in the embodiment illustrated in FIG. 1, the main display 200 may be divided into areas by the folding area 203 extended in parallel with the y-axis or the first axis (folding axis), but in another embodiment, the main display 200 may be divided into areas with reference to another folding area (for example, a folding area parallel to the x-axis) or another folding axis (for example, a folding axis parallel to the x-axis).

In an embodiment, the first display area 201 and the second display area 202 may have a substantially symmetrical shape with reference to the folding area 203. However, the second display area 202 may include a camera hole 150, differently from the first display area 201, but may have a symmetrical shape with the first display area 201 on the other area. In other words, the first display area 201 and the second display area 202 may include portions that have a symmetrical shape and portions that have an asymmetrical shape.

According to an embodiment, the camera hole 150 may be visually exposed to the outside of the electronic device 100. According to another embodiment, the camera hole 150 may be disposed on a lower portion of the main display 200 not to be visually exposed.

Hereinafter, operations of the first housing 111 and the second housing 112 and respective areas of the main display 200 according to a state (for example, the flat state 100A and the folded state 101B) of the electronic device 100 will be described.

In an embodiment, when the electronic device 100 is in the flat state 100A (for example, FIG. 1), the first housing 111 and the second housing 112 may form the angle of 180° and may be disposed to face in the same direction. A surface of the first display area 201 of the main display 200 and a surface of the second display area 202 may form the angle of 180° with each other, and may face in the same direction (for example, the front surface direction of the electronic device). The folding area 203 may form the same plane as the first display area 201 and the second display area 202.

In an embodiment, when the electronic device 100 is in the folded state 100B (for example, FIG. 2), the first housing 111 and the second housing 112 may be disposed to face each other. The surface of the first display area 201 of the main display 200 and the surface of the second display area 202 of the main display 200 may face each other while forming a small angle (for example, between 0° and 10°)

with each other. At least part of the folding area 203 may have a curved surface having a predetermined curvature.

In an embodiment, when the electronic device 100 is in the intermediate state, the first housing 111 and the second housing 112 may be disposed with a certain angle therebetween. The surface of the first display area 201 of the main display 200 and the surface of the second display area 202 of the main display 200 may form an angle that is larger than the angle in the folded state and is smaller than the angle in the flat state. At least part of the folding area 203 may have a curved surface having a predetermined curvature, and the curvature in this state may be smaller than in the folded state.

Figure 3:
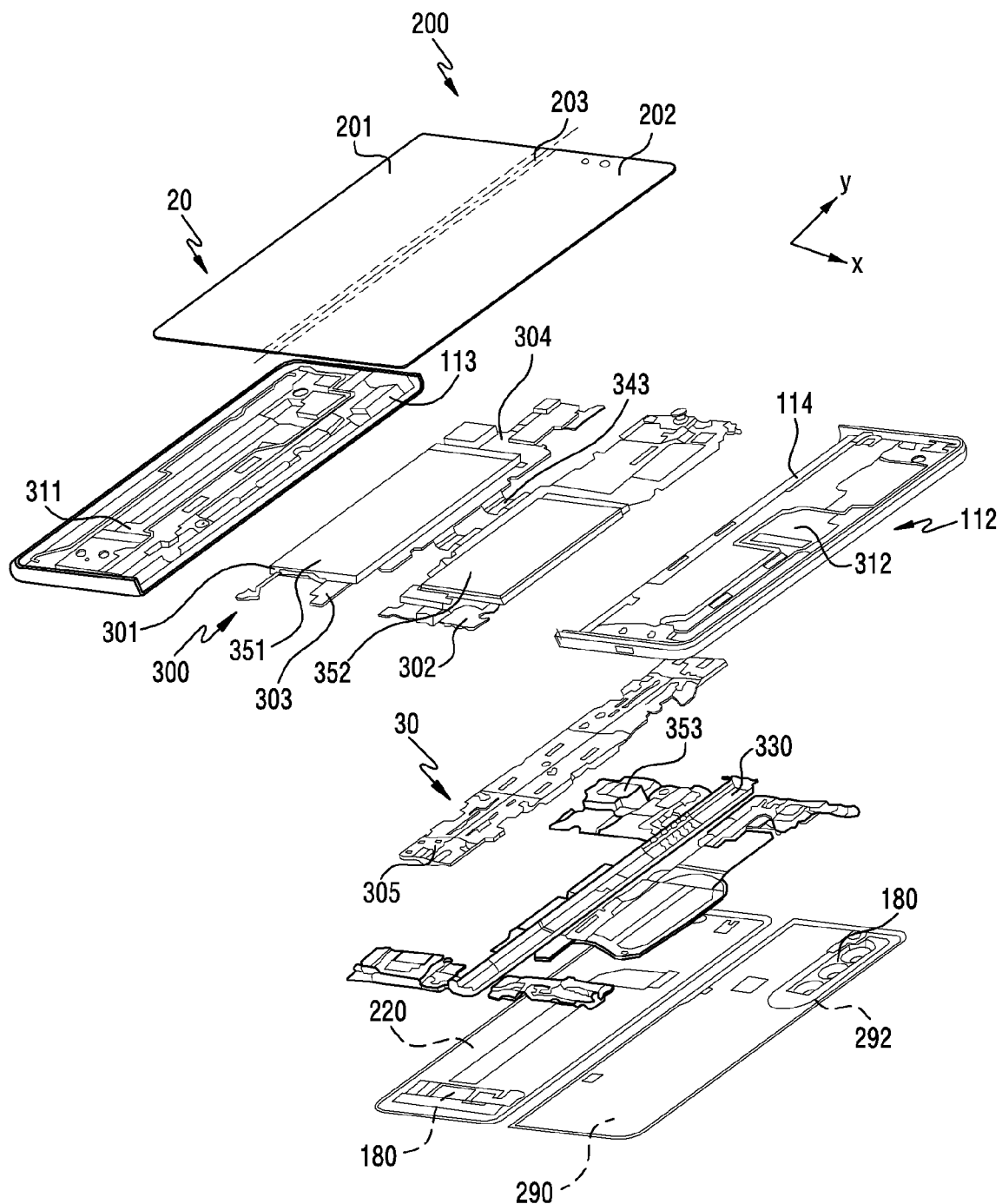
FIG. 3 is an exploded perspective view of an electronic device according to an embodiment.

FIG. 3 is an exploded perspective view of an electronic device according to an embodiment.

Referring to FIG. 3, in an embodiment, the electronic device 100 may include a display unit 20, a bracket assembly 30, a board unit 300, a first housing 111, a second housing 112, a first rear surface cover 180, and a second rear surface cover 190. In the disclosure, the display unit 20 may be referred to as a display module or a display assembly.

The display unit 20 may include a main display 200 and one or more plates or layers (not shown) on which the main display 200 is seated. In an embodiment, the plate may be disposed between the main display 200 and the bracket assembly 30. The main display 200 may be disposed on at least part of one surface (for example, an upper surface in FIG. 3) of the plate. The plate may be formed in a shape corresponding to the main display 200.

The bracket assembly 30 may include a bracket 310 including a first bracket 311, a second bracket 312, a hinge structure 305 disposed between the first bracket 311 and the second bracket 312, a hinge housing 330 to cover the hinge structure 305 when it is viewed from the outside, and a wire member 343 (for example, a flexible printed circuit (FPC)) crossing over the first bracket 311 and the second bracket 312.

Referring to FIG. 3, the hinge housing 330 may be disposed between the first housing 111 and the second housing 112, and may be configured to hide inner components (for example, the hinge structure 305). In an embodiment, the hinge housing 330 may be hidden by a part of the first housing 111 and the second housing 112, or may be exposed to the outside, according to a state (the flat state 100A or the folded state 100B) of the electronic device 100.

For example, when the electronic device 100 is in the flat state 100A as shown in FIG. 2, the hinge housing 330 may be hidden by the first housing 111 and the second housing 112 and may not be exposed. For example, when the electronic device 100 is in the folded state 100B (for example, a fully folded state) as shown in FIG. 3, the hinge housing 330 may be exposed to the outside between the first housing 111 and the second housing 112. For example, in an intermediate state in which the first housing 111 and the second housing 112 are folded with a certain angle, the hinge housing 330 may be exposed to the outside in part between the first housing 111 and the second housing 112. However, in this case, the exposed area may be smaller than in the fully folded state. In an embodiment, the hinge housing 330 may include a curved surface.

In an embodiment, the bracket assembly 30 may be disposed between the main display 200 and the board unit 300. For example, the first bracket 311 may be disposed between the first display area 201 of the main display 200, and a first board 301. The second bracket 312 may be disposed between the second display area 202 of the main display 200, and a second board 302.

In an embodiment, the wire member 343 and at least part of the hinge structure 305 may be disposed inside the bracket assembly 30. The wire member 343 may be disposed in a direction (for example, an x-axis direction) of crossing over the first bracket 311 and the second bracket 312. The wire member 343 may be disposed in a direction (for example, the x-axis direction) perpendicular to a folding axis (for example, the y-axis or the folding axis (first axis) of FIG. 2) of the folding area 203 of the electronic device 100.

As mentioned above, the board unit 300 may include the first board 301 disposed on the side of the first bracket 311, and the second board 302 disposed on the side of the second bracket 312. The first board 301 and the second board 302 may be disposed in a space formed by the bracket assembly 30, the first housing 111, the second housing 112, the first rear surface cover 180, and the second rear surface cover 190. Components for implementing various functions of the electronic device 100 may be mounted on the first board 301 and the second board 302.

According to an embodiment, the first board 301 may be formed of a plurality of boards. According to an embodiment, the first board 301 may have the plurality of boards which are separated. For example, the first board 301 may include a first printed circuit board 303 and a second printed circuit board 304 which are separated. The first housing 111 and the second housing 112 may be assembled with each other to be coupled to both sides of the bracket assembly 30 with the display unit 20 being coupled to the bracket assembly 30. As will be described below, the first housing 111 and the second housing 112 may slide from both sides of the bracket assembly 30 and may be coupled with the bracket assembly 30.

In an embodiment, the first housing 111 may include a first rotation support surface 113, and the second housing 112 may include a second rotation support surface 114 corresponding to the first rotation support surface 113. The first rotation support surface 113 and the second rotation support surface 114 may include curved surfaces corresponding to curved surfaces included in the hinge housing 330.

In an embodiment, when the electronic device 100 is in the flat state 100A (for example, the electronic device of FIG. 1), the first rotation support surface 113 and the second rotation support surface 114 may cover the hinge housing 330, such that the hinge housing 330 is not exposed to the rear surface of the electronic device 100 or is exposed to the minimum. On the other hand, when the electronic device 100 is in the folded state 100B (for example, the electronic device of FIG. 2), the first rotation support surface 113 and the second rotation support surface 114 may rotate along the curved surface included in the hinge housing 330, such that the hinge housing 330 is exposed to the rear surface of the electronic device 100 to the maximum.

According to an embodiment, the electronic device 100 may further include a first battery 351, a second battery 352, and a speaker module 353.

According to an embodiment, the first battery 351 and the second battery 352 may be mounted inside the housing 110 of the electronic device 100 and may not be exposed to the outside. For example, the first battery 351 may be mounted inside the first housing 111. In addition, the second battery 352 may be mounted inside the second housing 112.

According to an embodiment, the first battery 351 and the second battery 352 may be electrically connected with each other by the wire member 343 (for example, a flexible printed circuit board) disposed between the first housing 111 and the second housing 112.

According to an embodiment, the speaker module 353 may be disposed inside the first housing 111. For example, the speaker module 353 may be disposed on a certain area adjacent to the first battery 351 inside the first housing 111. According to an embodiment, the speaker module 353 may not be exposed to the outside of the electronic device 100. According to an embodiment, the speaker module 353 may be mounted on the second printed circuit board 304 of the first board 301.

Figure 4:
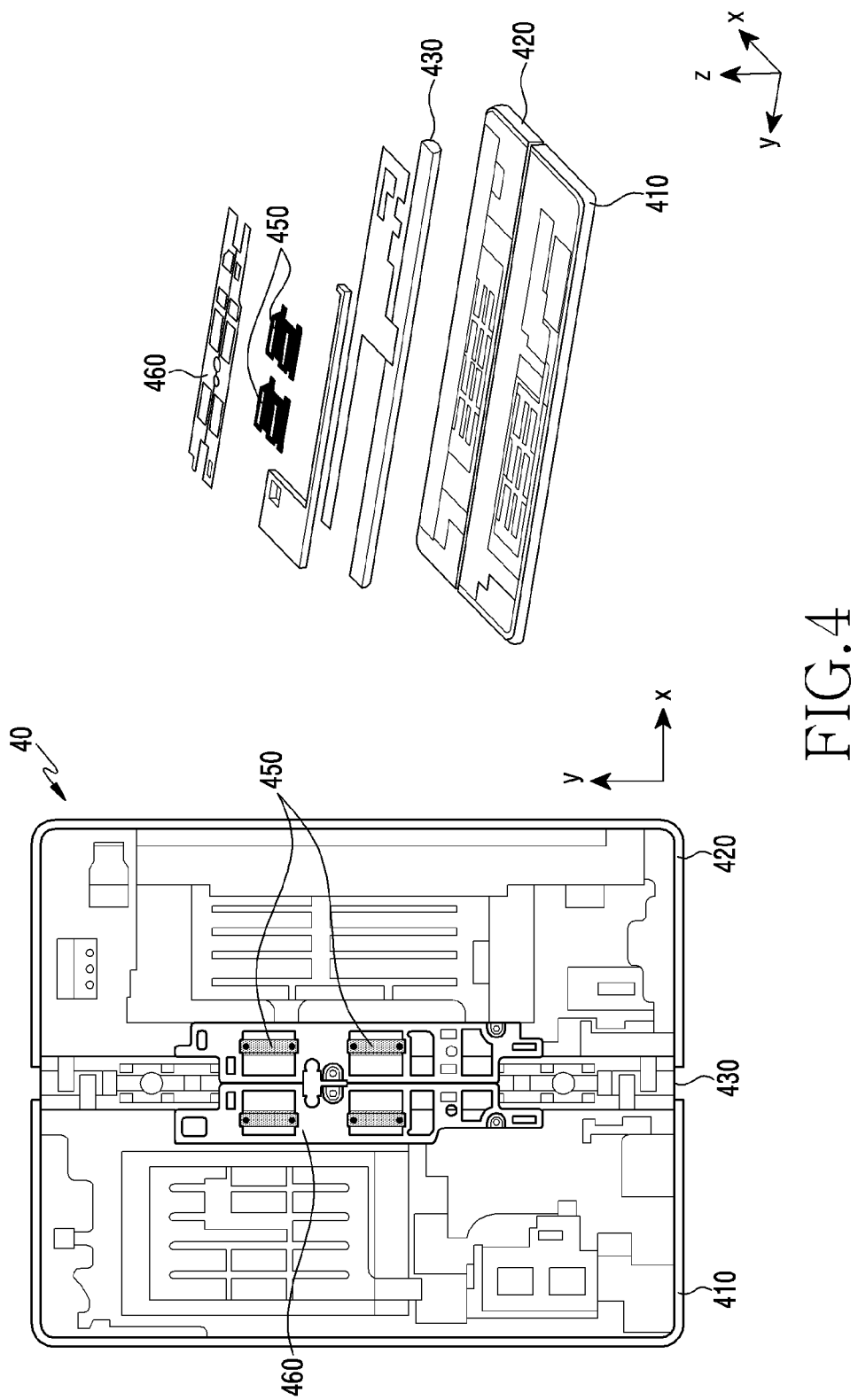
FIG. 4 is a top view and an exploded perspective view of an electronic device including a flexible printed circuit board according to an embodiment.

FIG. 4 is a top view and an exploded perspective view of an electronic device 40 including a flexible printed circuit board 450 according to an embodiment. FIG. 5 is a cross-sectional view of an electronic device 40 including a flexible printed circuit board 450 according to an embodiment. As used herein, the "top view" means a view in a z-axis direction, and a plan view.

The electronic device 40 may be referred to by the electronic device 10 of FIGS. 1 to 3. For example, a hinge plate 460 of FIG. 5 may be referred to by the bracket 310 of FIGS. 1 to 3. Regarding components which are the same as or substantially the same as those described above, a redundant explanation will be omitted.

Referring to FIG. 4, in an embodiment, the electronic device 40 may include a first housing 410, a second housing 420 connected with the first housing 410 by a hinge structure, a hinge housing 430 including the hinge structure, and at least one printed circuit board 450. However, the components of the electronic device 40 are not limited thereto. For example, the electronic device 40 may omit at least one component of the above-described components or may further include other components. For example, the electronic device 40 may include a first hinge plate disposed in the first housing 410 and a second hinge plate disposed in the second housing 420.

According to an embodiment, the electronic device 40 may include at least one hinge structure. The hinge structure may be disposed inside the hinge housing 430. The hinge structure may be disposed on a fixed position inside the hinge housing 430, and may be disposed on an area corresponding to a folding area of a display. At least part of the printed circuit board 450 may be disposed on an area corresponding to the folding area of the display. According to an embodiment, the printed circuit board 450 may include a flexible printed circuit board 450 at least part of which is deformable. According to an embodiment, the flexible printed circuit board 450 may connect a printed circuit board disposed in the first housing 410 and a printed circuit board disposed in the second housing 420.

According to an embodiment, at least part of the flexible printed circuit board 450 may be deformable according to whether the electronic device 40 is folded or unfolded. For example, at least part of the flexible printed circuit board 450 may be bent or unbent according to whether the electronic device 40 is folded or unfolded. According to an embodiment, the flexible printed circuit board 450 may include a conductive material having flexibility. For example, the flexible printed circuit board 450 may be formed in a conductive thin film pattern such as a copper thin film on a polyimide film. However, this should not be considered as limiting the invention. The flexible printed circuit board 450 includes a material having flexibility, such that a damage to the flexible printed circuit board 450 may be effectively prevented from occurring by folding of the electronic device.

Figure 5A:
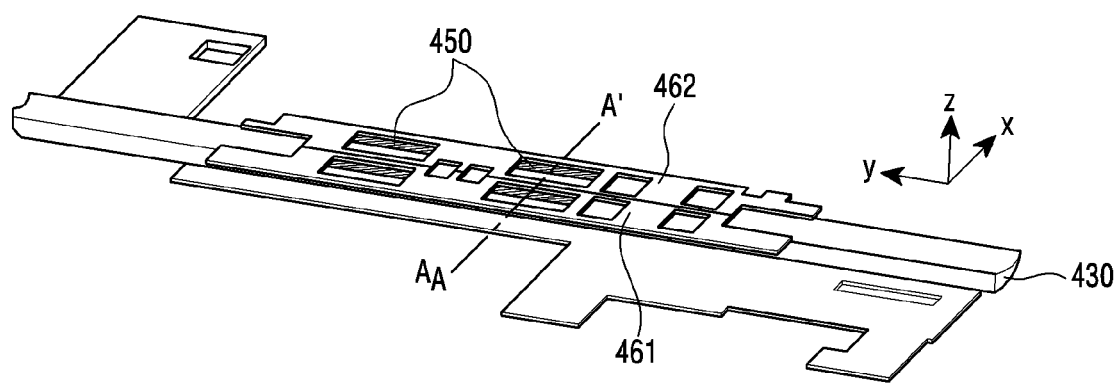
FIGS. 5A to 5C are views to explain a cross-section of an electronic device including a flexible printed circuit board according to an embodiment.
Figure 5B:
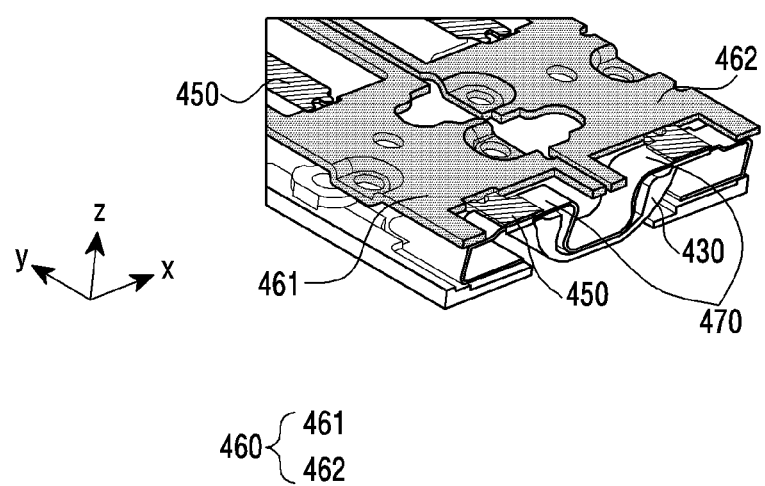
Figure 5C:
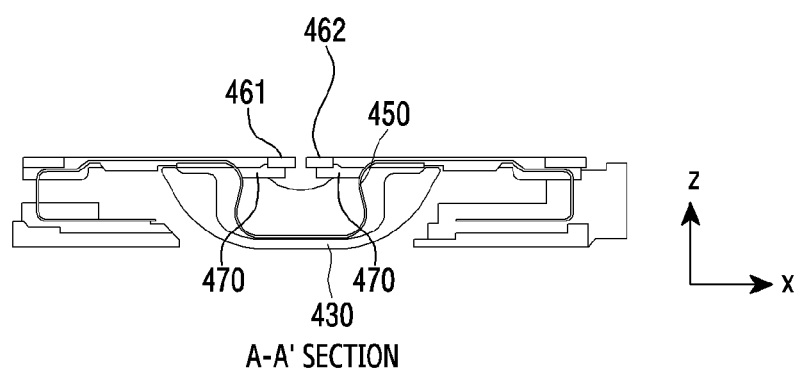

FIG. 5A is a perspective view illustrating a hinge housing 430 in which a flexible printed circuit board 450 and a hinge plate 460 are disposed. FIG. 5B is a cross-sectional perspective view of the hinge housing 430, taken along line A-A' of FIG. 5A. FIG. 5C is a cross-sectional view of the hinge housing 430, taken along line A-A' of FIG. 5A.

Referring to FIG. 5, in an embodiment, a first hinge plate 461 and a second hinge plate 462 may be connected with each other to be foldable by a hinge structure. When an electronic device (for example, the electronic device 40 of FIG. 4) is in a folded state, one surface of the first hinge plate 461 and one surface of the second hinge plate 462 may face each other. When the electronic device 10 is in a flat state, one surface of the first hinge plate 461 and one surface of the second hinge plate 462 may face in the same direction (for example, a +z axis).

According to an embodiment, the flexible printed circuit board 450 may be disposed in a direction (for example, an x-axis direction) perpendicular to a folding axis (or rotation axis) (for example, a y-axis direction) of the electronic device 40. The flexible printed circuit board 450 may cross over the first hinge plate 461 and the second hinge plate 462 which are disposed on both sides of the hinge housing 430. In various embodiments, the arrangement direction of the flexible printed circuit board 450 is not necessarily limited to the direction (for example, the x-axis direction) perpendicular to the folding axis.

According to an embodiment, the hinge plate 460 may be coupled with the hinge housing 430. According to an embodiment, the hinge plate 460 may have at least one guide hole 470 formed thereon. At least part of the flexible printed circuit board 450 may be inserted into an inner space of the hinge housing through the guide hole 470, or at least part may be removed from the inside of the hinge housing. The guide hole 470 may guide a movement of the flexible printed circuit board 450 when the electronic device 40 is folded. For example, at least part of the flexible printed circuit board 450 may be inserted into the guide hole 479, and an area of the flexible printed circuit board 450 that is inserted into the guide hole 470 may move in a direction toward the front surface of the electronic device 40 (for example, the +z axis direction) when the electronic device 40 is folded. According to an embodiment, at least part of the flexible printed circuit board 450 may be exposed to one surface of the first hinge plate 461 or one surface of the second hinge plate 462 through the guide hole 470.

According to an embodiment, when the electronic device 40 is in a folded state, at least part of the flexible printed circuit board 450 may be disposed in an inner space of the hinge housing 430. For example, the flexible printed circuit board 450 may be disposed in a direction from the first hinge plate 461 to the second hinge plate 462 across a space formed by the hinge housing 430 and a display layer 480. At least part of the flexible printed circuit board 450 that is disposed in the inner space of the hinge housing 430 may be removed from the space through the guide hole 470 of the first hinge plate 461 and the second hinge plate 462.

According to an embodiment, the flexible printed circuit board 450 extended toward the first hinge plate 461 and the second hinge plate 462 may be extended to a main printed circuit board of the electronic device 40. For example, the flexible printed circuit board 450 may have one end electrically connected with a first printed circuit board disposed in a first housing (for example, the first housing 410 of FIG. 4), and the other end electrically connected with a second printed circuit board disposed in a second housing (for example, the second housing 420 of FIG. 4).

According to an embodiment, the flexible printed circuit board 450 may be fixed to one surface of the hinge plate 460. As described above, at least part of the flexible printed circuit board 450 may be inserted into the hinge housing through the guide holes 470, such that the flexible printed circuit board 450 is primarily fixed. The flexible printed circuit board 450 may further be fixed secondarily by a fixing structure formed on the flexible printed circuit board and a fixing member formed on the hinge plate 460.

Figure 6A:
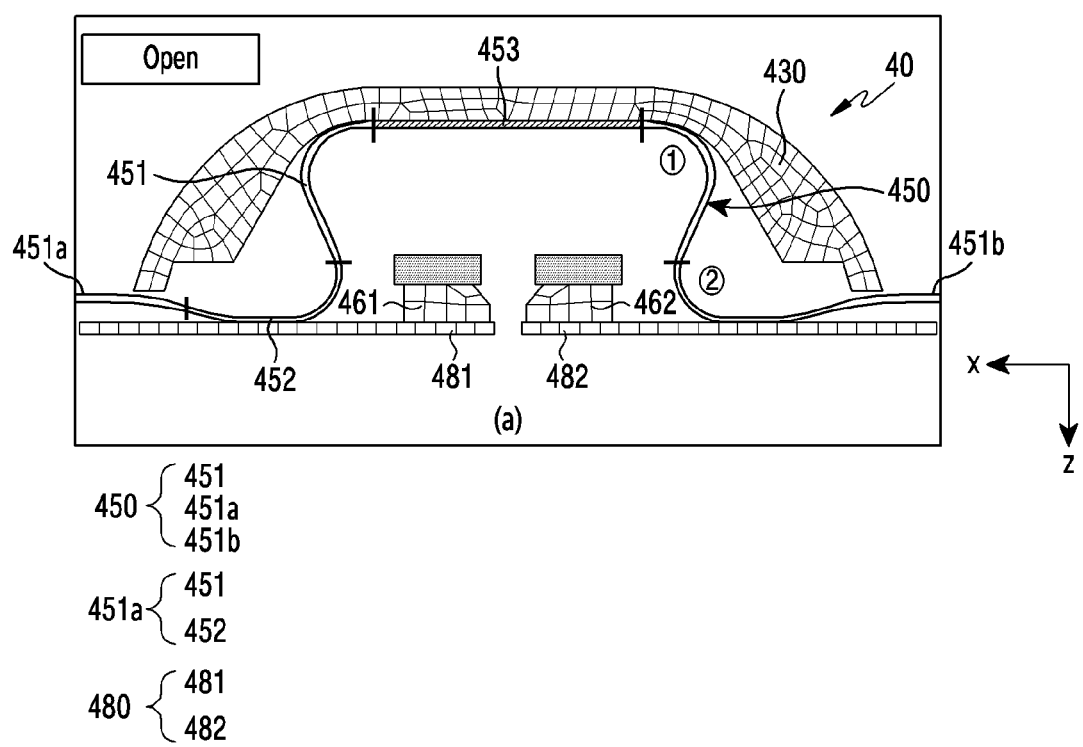
FIGS. 6A and 6B are cross-sectional views illustrating a flexible printed circuit board in a flat state or a folded state of an electronic device according to an embodiment.
Figure 6B:
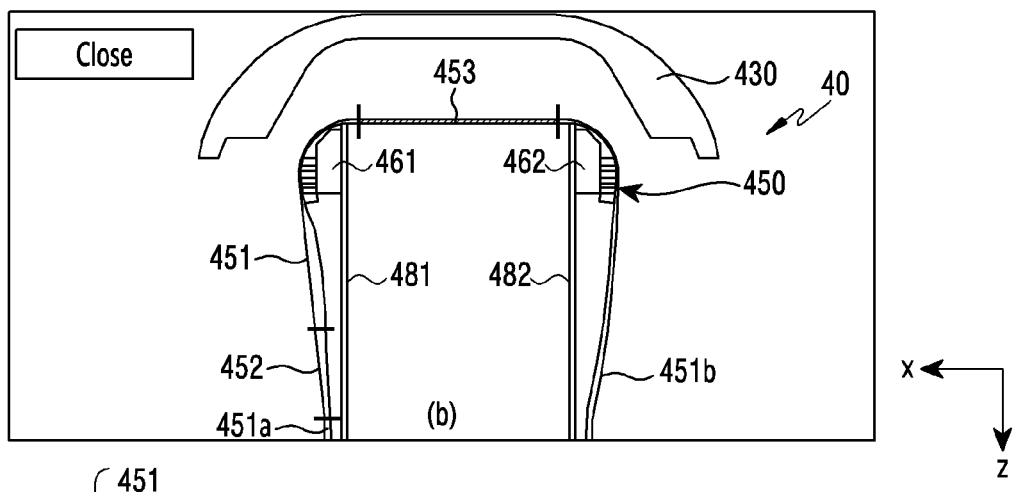

FIGS. 6A and 6B are cross-sectional views illustrating a flexible printed circuit board 450 in a flat state or a folded state of an electronic device 40 according to an embodiment, respectively.

FIG. 6A illustrates a flat state of the electronic device 40 and FIG. 6B illustrates a folded state of the electronic device 40.

The electronic device 40 and the flexible printed circuit board 450 may be referred to by the electronic device 40 and the flexible printed circuit board 450 of FIGS. 4 and 5. Regarding components which are the same as or substantially the same as those described above, the same reference numerals are used and a redundant explanation will be omitted.

Referring to FIG. 6, the flexible printed circuit board 450 may include a first section 451 and a second section 452 which is extended from one side of the first section 451. However, the configuration of the flexible printed circuit board is not limited thereto. For example, the flexible printed circuit board 450 may omit at least one section of the above-described sections or may further include at least one other section in another embodiment. In still another embodiment, for example, the flexible printed circuit board 450 may include a third section 453 extended from the other side of the first section 451.

According to an embodiment, the flexible printed circuit board 450 may be symmetrical with reference to the third section 453. However, this should not be considered as limiting the invention.

According to an embodiment, a shape of at least part of the flexible printed circuit board 450 may be changed according to whether the electronic device is in the folded state or flat state (i.e., unfolded state). For example, when the electronic device 40 is in the folded state, the second section 452 of the flexible printed circuit board 450 may be bent (may have a curved shape or may have a curved cross section), and, when the electronic device 40 is in the flat state, the second section 452 may be unbent (may have a flat shape or may have a linear cross section. However, this should not be considered as limiting the invention.

According to an embodiment, the third section 453 may be disposed to correspond to a folding area of the electronic device 40. For example, referring to FIG. 6A, when the electronic device 40 is in the flat state (i.e., open state), the third section 453 may be disposed in a space formed by the hinge housing 430 and the display layer 480 (including a first display layer 481 and a second display layer 482) or the hinge plate 460. According to an embodiment, the third section 453 may include a linear area at least part of which has a flat surface. The third section 453 may refer to a section that maintains its shape even when the electronic device is both in the folded state and flat state. For example, the third section 453 may refer to a section that maintains a linear shape (or a flat shape) when the electronic device 40 is in the folded state or flat state.

According to an embodiment, the flexible printed circuit board 450 may include a first connection section 451a extended from one side of the third section 453, and a second connection section 451b extended from the other side of the third section 453. The first connection section 451a may include the first section 451 which is extended from the one side of the third section 453, and the second section 452 which is extended from one side of the first section 451. However, the flexible printed circuit board 450 is not limited thereto. For example, the first connection section 451a of the flexible printed circuit board 450 may further include at least one section extended from one side of the second section 452.

According to an embodiment, the first section 451 may include a curved portion which has a curvature. For example, the first section 451 may include a shape that is bent from one side of the third section 453 in a folding direction (for example, a +z axis direction) of the electronic device 40. The first section 451 may include a curved surface which is seamlessly formed between the third section 453 and the second section 452. According to an embodiment, the first section 451 may refer to a section that maintains its curved shape when the electronic device is changed from folded to unfolded, and vice versa. For example, the first section 451 may refer to a section that maintains a curved shape having a curvature even when the electronic device 40 is folded or unfolded.

According to an embodiment, the second section 452 may refer to a section the shape of which is changed when the electronic device 40 is changed from folded to unfolded, and vice versa. The second section 452 of the flexible printed circuit board 450 may be bent or unbent when the electronic device 40 is folded or unfolded. For example, the second section 452 may refer to a section that forms a linear area at least part of which is a flat surface in the folded state of the electronic device 40, and forms a curved surface having a curvature in the flat state of the electronic device 40.

According to an embodiment, when the electronic device 40 is changed from the flat state to the folded state, a variance in the curvature of the second section 452 may be greater than a variance in the curvature of the first section 451. In another embodiment, when a first housing (for example, the first housing 410 of FIG. 4) and a second housing (for example, the second housing 420 of FIG. 4) rotate through a hinge structure, a variance in the curvature of the second section 452 may be greater than a variance in the curvature of the first section 451.

According to an embodiment, a repulsive force generated by elasticity according to bending of the second section 452 of the flexible printed circuit board 450 may be greater than a repulsive force of the first section 451 due to the variance difference. Since the second section 452 is less bent than the first section 451 due to the greater repulsive force, the curvature of the second section 452 which is bent in the flat state of the electronic device as shown in FIG. 6A may be smaller than the curvature of the first section 451 in the flat state. Accordingly, since the variance in the curvature of the second section 452 caused by folding and unfolding of the electronic device 40 is reduced, the second section 452 may effectively prevent a damage to the flexible printed circuit board 450 occurring by repeated folding of the electronic device 40.

Figure 7:
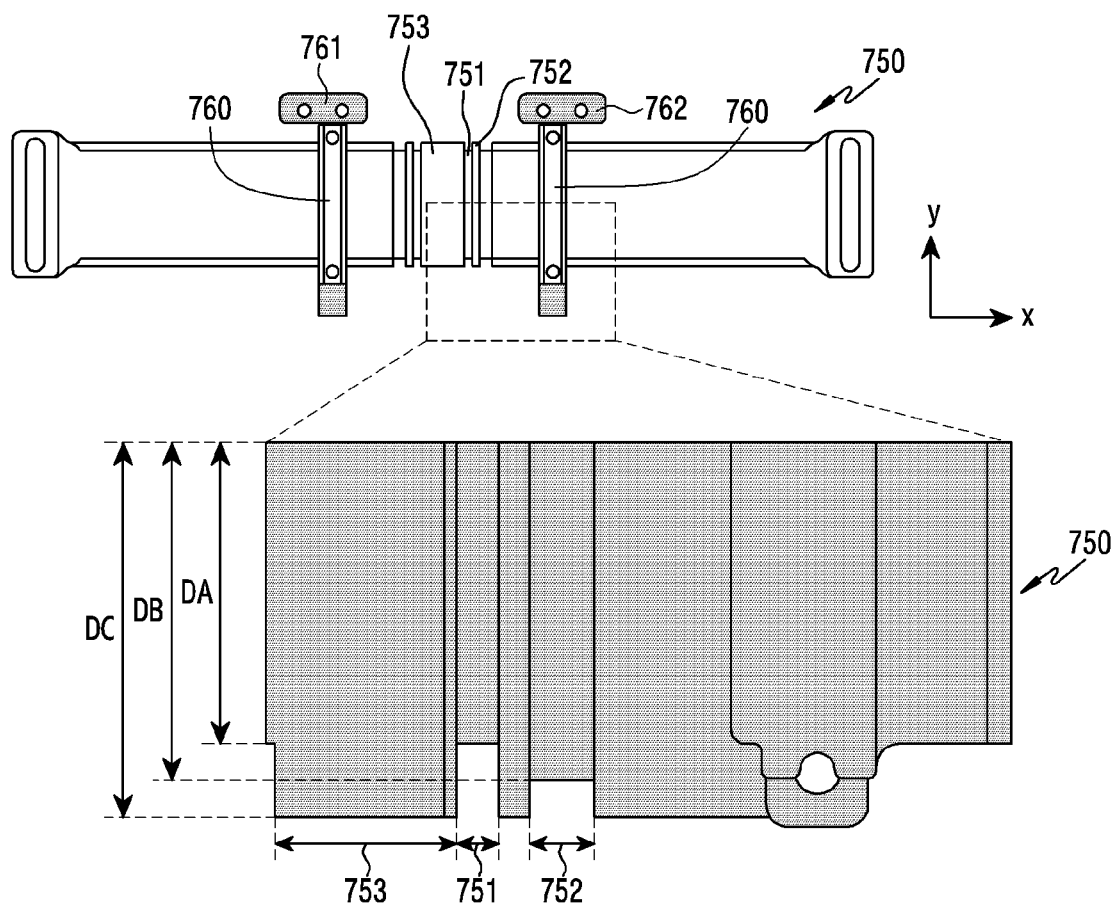
FIG. 7 is a top view of a flexible printed circuit board according to an embodiment.

FIG. 7 is a top view of a flexible printed circuit board 750 according to an embodiment.

The flexible printed circuit board 750 may be referred to by the flexible printed circuit board 450 of FIGS. 4 to 6. Regarding components which are the same as or substantially the same as those described above, a redundant explanation will be omitted.

Referring to FIG. 7, the flexible printed circuit board 750 may include a third section 753, a first section 751 extended from one side and/or the other side of the third section 753, and a second section 752 extended from one side of the first section 751. The flexible printed circuit board 750 may include a fixing area 760 to be fixed to an electronic device (for example, the electronic device 40 of FIG. 4). For example, the fixing area 760 of the flexible printed circuit board 750 may include a first fixing structure 761 fixed to a first hinge plate (for example, the first hinge plate 461 of FIG. 5), and a second fixing structure 762 fixed to a second hinge plate (for example, the second hinge plate 462 of FIG. 5). However, this should not be considered as limiting the invention. In another embodiment, the flexible printed circuit board 750 may omit or further include at least one fixing structure. For example, the flexible printed circuit board 750 may further include a third fixing structure which is opposite to the first fixing structure 761 with reference to the flexible printed circuit board 750, and a fourth fixing structure which is opposite to the second fixing structure 762 with reference to the flexible printed circuit board 750.

According to an embodiment, the fixing area 760 may be disposed to be perpendicular to a longitudinal direction (for example, an x-axis direction) of the flexible printed circuit board 750. The fixing area 760 may be disposed to face in the same direction as a rotation axis (or folding axis) direction (for example, a y-axis direction) of a hinge structure of an electronic device (for example, the electronic device 40 of FIG. 4). However, in various embodiments, the arrangement direction of the fixing area 760 is not necessarily limited to the direction (for example, the y-axis direction) perpendicular to the longitudinal direction of the flexible printed circuit board 750 or to the same direction as the rotation axis of the hinge structure.

Referring to FIG. 7, widths of sections of the flexible printed circuit board 750 according to an embodiment may be different from one another. The width may refer to a length in the direction perpendicular to the longitudinal direction (for example, the x-axis direction) of the flexible printed circuit board 750. In other word, the width may refer to a rotation axis direction (for example, the y-axis direction) of the hinge structure of the electronic device 40. The rotation axis direction may refer to a direction of penetrating through the rotation axis of the hinge structure.

According to an embodiment, a width DB of the second section 752 of the flexible printed circuit board 750 may be larger than a width DA of the first section 751. That is, a length (i.e., width DB) of the second section 752 of the flexible printed circuit board 750 in the rotation axis direction (for example, the y-axis direction) of the hinge structure may be longer than a length (i.e., width DA) of the first section 751 in the rotation axis direction. Accordingly, a repulsive force of the second section 752 generated by elasticity according to bending of the flexible printed circuit board 750 may be greater than a repulsive force of the first section 751. Since the width DB of the second section 752 is larger than the width DA of the first section 751, a stress of the second section 752 may be greater than a stress of the first section 751. Due to the difference in the stress between the first section 751 and the second section 752, the flexible printed circuit board 750 may be bent with the curvature of the second section 752 being smaller than the curvature of the first section 751 when the electronic device is unfolded and the flexible printed circuit board 750 is bent. Accordingly, the second section 752 the curvature of which is changed more greatly than the first section 751 according to bending of the flexible printed circuit board may be effectively prevented from being damaged.

According to an embodiment, a width DC of the third section 753 of the flexible printed circuit board 750 may be larger than each of the width DA of the first section 751 and the width DB of the second section 752. A length of the third section 753 of the flexible printed circuit board 750 in the rotation axis direction (for example, the y-axis direction) of the hinge structure may be longer than the length of each of the first section 751 and the second section 752.

Figure 8:
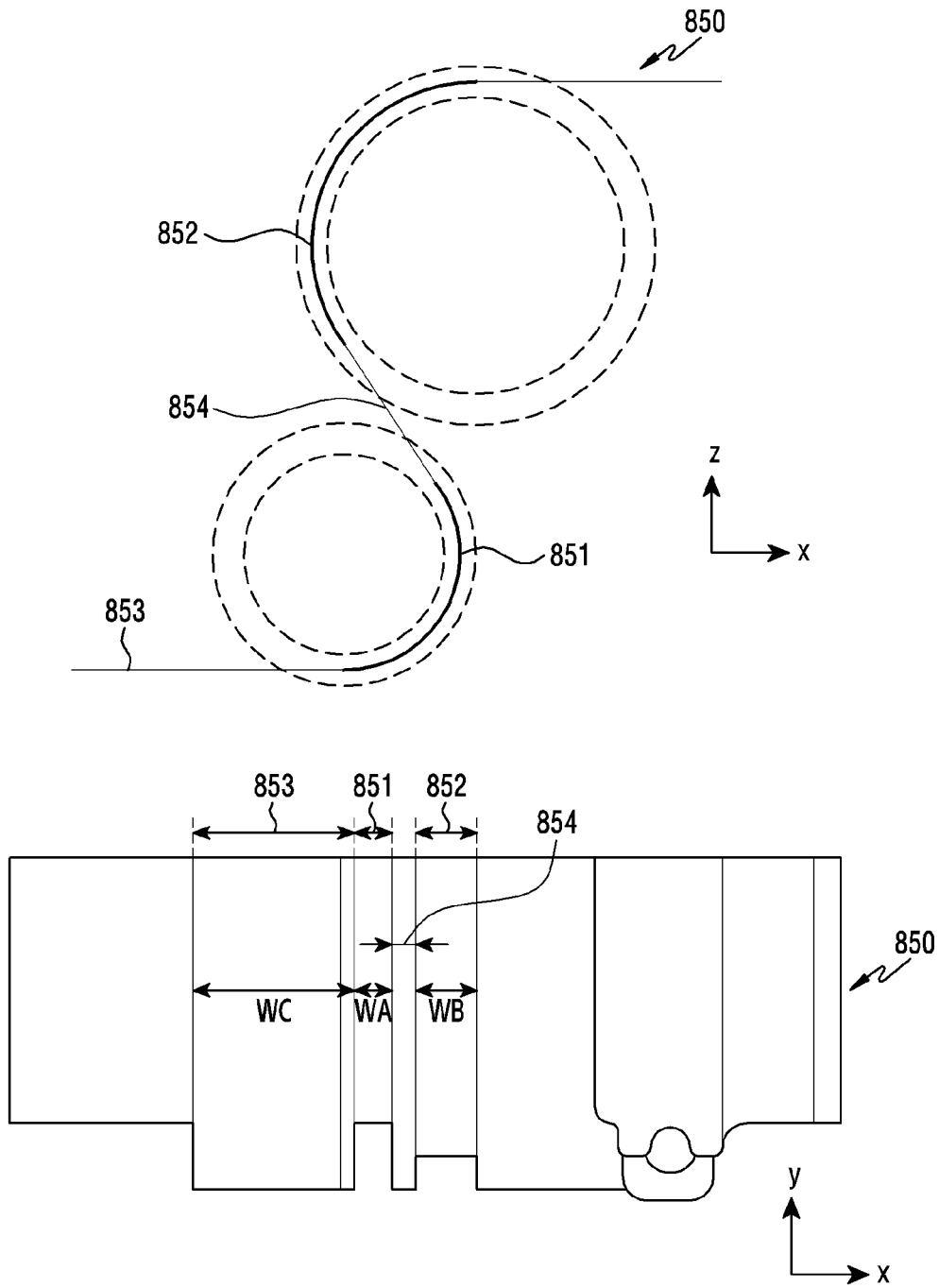
FIG. 8 is a cross-sectional view and a top view illustrating a flexible printed circuit board according to an embodiment.

FIG. 8 is a cross-sectional view and a top view illustrating a flexible printed circuit board according to an embodiment.

The flexible printed circuit board 850 may be referred to by the flexible printed circuit board 450 of FIGS. 4 to 6, and the flexible printed circuit board 750 of FIG. 7. Regarding components which are the same as or substantially the same as those described above, a redundant explanation will be omitted.

According to an embodiment, the flexible printed circuit board 850 may further include a linear section 854 which is disposed between a first section 851 and a second section 852. In another embodiment, the linear section 854 may be a section that is included in the first section 851.

Referring to FIG. 8, widths of the sections of the flexible printed circuit board 820 according to an embodiment may be different from one another. The width may refer to a length of the flexible printed circuit board 850 in a longitudinal direction (for example, an x-axis direction). In other word, the width may refer to a length along a surface of the flexible printed circuit board 850 in a direction from one end of the flexible printed circuit board 850 that is connected with a first printed circuit board disposed in a first housing (for example, the first housing 410 of FIG. 4) to the other end of the flexible printed circuit board 850 that is connected with a second printed circuit board disposed in a second housing (for example, the second housing 420 of FIG. 4).

According to an embodiment, a width WB of the second section 852 of the flexible printed circuit board 850 may be larger than a width WA of the first section 851. A length (i.e., WB) of the second section 852 of the flexible printed circuit board 850 in the longitudinal direction (e.g., x axis direction) of the flexible printed circuit board 850 may be longer than a length (i.e., WA) of the first section 851. Accordingly, a repulsive force of the second section 852 generated by elasticity according to bending of the flexible printed circuit board 850 may be greater than a repulsive force of the first section 851. Since the width WB of the second section 852 is larger than the width WA of the first section 851, the second section 852 may be bent or unbent over a larger section. Accordingly, the second section 852 the curvature of which is changed more greatly than the first section 851 according to bending of the flexible printed circuit board may be effectively prevented from being damaged.

According to an embodiment, a width WC of a third section 853 of the flexible printed circuit board 850 may be larger than each of the width WA of the first section 851 and the width WB of the second section 852. That is, a length of the third section 853 of the flexible printed circuit board 850 in the longitudinal direction (for example, the x-axis direction) of the flexible printed circuit board 850 may be longer than the length of each of the first section 851 and the second section 852.

Figure 9:
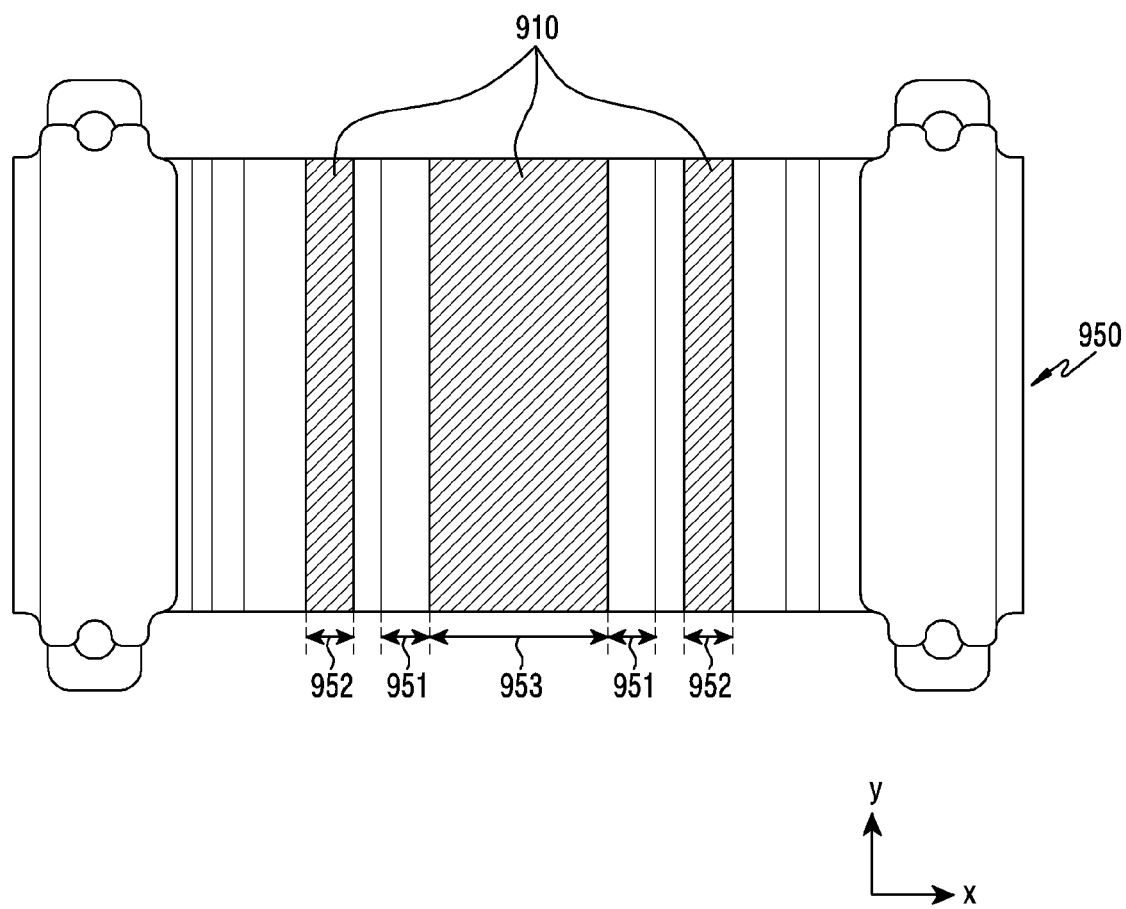
FIG. 9 is a top view illustrating a flexible printed circuit board including a stiffener or a coating layer according to an embodiment.

FIG. 9 is a top view illustrating a flexible printed circuit board 950 including at least one of a stiffener 910 or a coating layer according to an embodiment.

The flexible printed circuit board 950 may be referred to by the flexible printed circuit board 450 of FIGS. 4 to 6, the flexible printed circuit board 750 of FIG. 7, and the flexible printed circuit board 850 of FIG. 8. Regarding components which are the same as or substantially the same as those described above, a redundant explanation will be omitted.

Referring to FIG. 9, thicknesses of sections of the flexible printed circuit board 950 according to an embodiment may be different from one another. As used herein, the "thickness" is measured in a direction normal to a plane of the flexible printed circuit board (e.g., the z direction). According to an embodiment, a thickness of a second section 952 of the flexible printed circuit board 950 may be thicker than a thickness of a first section 951. Accordingly, a repulsive force of the second section 952 generated by elasticity according to bending of the flexible printed circuit board 950 may be greater than a repulsive force of the first section 951. Since the thickness of the second section 952 is thicker than the thickness of the first section 951, a stress of the second section 952 may be greater than a stress of the first section 951. Due to the difference in the stress between the first section 951 and the second section 952, the flexible printed circuit board 950 may be bent with the curvature of the second section 952 being smaller than the curvature of the first section 951 when the electronic device is unfolded and the flexible printed circuit board 950 is bent. Accordingly, the second section 952 the curvature of which is changed more greatly than the first section 951 according to bending of the flexible printed circuit board 950 may be effectively prevented from being damaged.

According to an embodiment, a thickness of a third section 953 of the flexible printed circuit board 950 may be thicker than the thickness of each of the first section 951 and the second section 952. Accordingly, a repulsive force of the third section 953 generated by elasticity according to bending of the flexible printed circuit board 950 may be greater than a repulsive force of each of the first section 951 or the second section 952.

According to an embodiment, the second section 952 of the flexible printed circuit board 950 may further include at least one of at least one stiffener 910 or at least one coating layer than the first section 951. The at least one of at least one stiffener 910 or at least one coating layer may be stacked in the thickness direction. Accordingly, the thickness of the second section 952 may be thicker than the thickness of the first section 951. The second section 952 further includes at least one of the stiffener 910 or the coating layer than the first section 951, such that a repulsive force of the second section 952 generated by elasticity according to bending of the flexible printed circuit board 950 is greater than a repulsive force of the first section 951. Since the second section 952 is less bent than the first section 951 due to the greater repulsive force, the curvature of the second section 952 which is bent in the flat state of the electronic device may be smaller than the curvature of the first section 951. Accordingly, since a variance in the curvature of the second section 952 caused by folding and unfolding of the electronic device is reduced, the second section 952 the curvature of which is changed more greatly than the first section 951 according to bending of the flexible printed circuit board may be effectively prevented from being damaged.

According to an embodiment, the stiffener 910 may include at least one high-polymer layer. For example, the stiffener 910 may include at least one of polyimide (PI) or plastic. However, this should not be considered as limiting the invention. According to an embodiment, the coating layer may include an electro-magnetic interference (EMI) coating layer. However, this should not be considered as limiting the invention.

Figure 10:
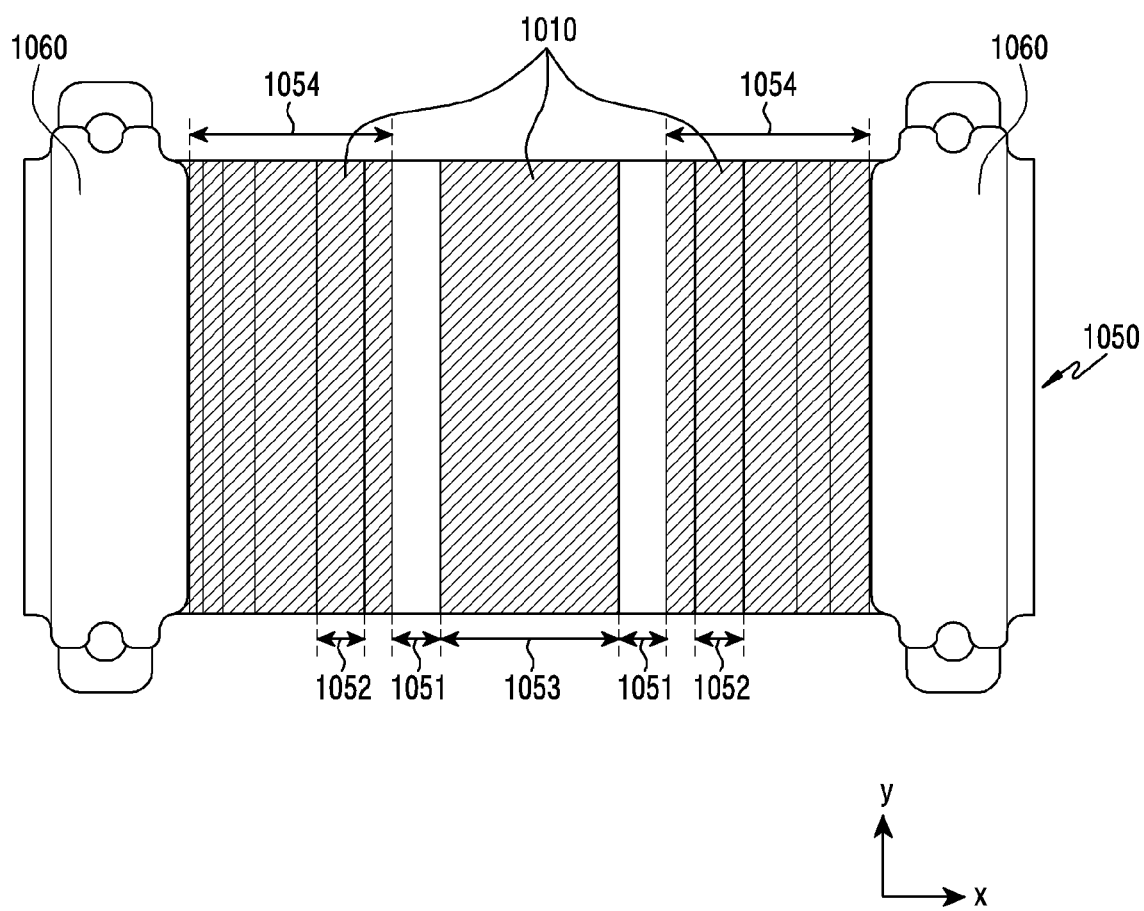
FIG. 10 is a top view illustrating a flexible printed circuit board including a stiffener or a coating layer according to another embodiment.

According to an embodiment, the third section 953 of the flexible printed circuit board 950 may further include at least one of the stiffener 910 or the coating layer than at least one of the first section 951 or the second section 952. Accordingly, the thickness of the third section 953 may be thicker than the thickness of at least one of the first section 951 or the second section 952. FIG. 10 is a top view illustrating a flexible printed circuit board including a stiffener or a coating layer according to another embodiment.

The flexible printed circuit board 1050 may be referred to by the flexible printed circuit board 450 of FIGS. 4 to 6 and the flexible printed circuit board 750, 850, 950 of FIGS. 7 to 9. Regarding components which are the same as or substantially the same as those described above, a redundant explanation will be omitted.

According to an embodiment, if a length of a second section 1052 in a longitudinal direction (for example, an x-axis direction) of the flexible printed circuit board 1050 is not long or an area of the second section 1052 is small when the flexible printed circuit board 1050 is mass-produced, it may not be easy to dispose a stiffener or to coat a coating layer on the second section 1052. Accordingly, an area that includes the second section 1052 or an area that is adjacent to the second section 1052 may further include a stiffener or a coating layer.

According to an embodiment, in the flexible printed circuit board 1050, a thickness of an area 1054 between a first section 1051 and a fixing area 1060 may be thicker than a thickness of the first section 1051. The area 1054 may be an area that includes the second section 1052. The flexible printed circuit board 1050 may further include at least one of at least one stiffener 1010 or at least one coating layer in the area 1054 between the first section 1051 and the fixing area 1060. The stiffener 1010 may include at least one high-polymer layer. For example, the stiffener 1010 may include at least one of polyimide (PI) or plastic. According to an embodiment, the coating layer may include an electro-magnetic interference (EMI) coating layer. However, this should not be considered as limiting the invention.

According to an embodiment, the area 1054 between the first section 1051 and the fixing area 1060 may further include at least one of the stiffener 1010 or the coating layer than the first section 1051, such that a repulsive force of the area 1054 generated by elasticity according to bending of the flexible printed circuit board 1050 is greater than a repulsive force of the first section 1051. Since the area 1054 is less bent than the first section 1051 due to the greater repulsive force, the curvature of the area 1054 which is bent in the flat state of the electronic device may be smaller than the curvature of the first section 1051. Accordingly, since a variance in the curvature of the area 1054 caused by folding and unfolding of the electronic device is reduced, the area 1054 the curvature of which is changed more greatly than the first section 1051 according to bending of the flexible printed circuit board may be effectively prevented from being damaged.

Figure 11:
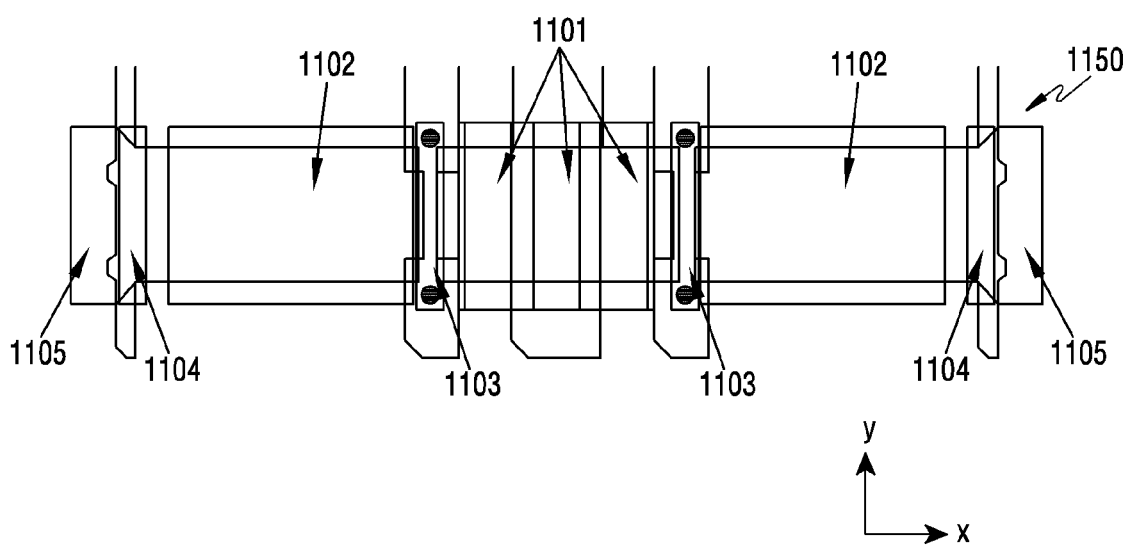
FIG. 11 is a top view of a flexible printed circuit board according to an embodiment.

FIG. 11 is a top view of a flexible printed circuit board according to an embodiment.

The flexible printed circuit board 1150 may be referred to by the flexible printed circuit board 450 of FIGS. 4 to 6 and the flexible printed circuit board 750, 850, 950, 1050 of FIGS. 7 to 10. Regarding components which are the same as or substantially the same as those described above, a redundant explanation will be omitted.

Referring to FIG. 11, the flexible printed circuit board 1150 may include a first area 1101 in which a stress generated according to bending or unbending of the flexible printed circuit board 1150 is relatively great, a fixing area 1103 which is extended from one side of the first area 1101, a second area 1102 which is extended from one side of the fixing area 1103, and a third area 1104, 1105 which is connected with a printed circuit board. However, this should not be considered as limiting the invention. In another embodiment, for example, the flexible printed circuit board 1150 may omit at least one of the above-described areas or may further include at least one other area.

According to an embodiment, a thickness of the first area 1101 may be thicker than a thickness of the second area 1102. According to an embodiment, the first area 1101 may further include at least one of a stiffener or a coating layer than the second area 1102. For example, the first area 1101 may further include at least one high-polymer layer than the second area 1102. According to an embodiment, the stiffener may include at least one of polyimide (PI) or plastic. According to an embodiment, the coating layer may include an electro-magnetic interference (EMI) coating layer. However, this should not be considered as limiting the invention.

According to an embodiment, at least one of the first area 1101 or the third area 1105 may further include at least one metal layer. For example, at least one of the first area 1101 or the third area 1105 may include a steel use stainless (SUS) layer. However, this should not be considered as limiting the invention.

According to an embodiment, at least one of the fixing area 1103 or the third area 1104, 1105 may further include at least one resin layer than the first area 1101 or the second area 1102. For example, at least one of the fixing area 1103 or the third area 1104, 1105 may further include a prepreg than the first area 1101 or the second area 1102. However, this should not be considered as limiting the invention.

According to an embodiment, at last one of the third area 1104 or the second area 1102 may further include a protection layer than at least one of the first area 1101 or the fixing area 1103. However, this should not be considered as limiting the invention.

Figure 12A:
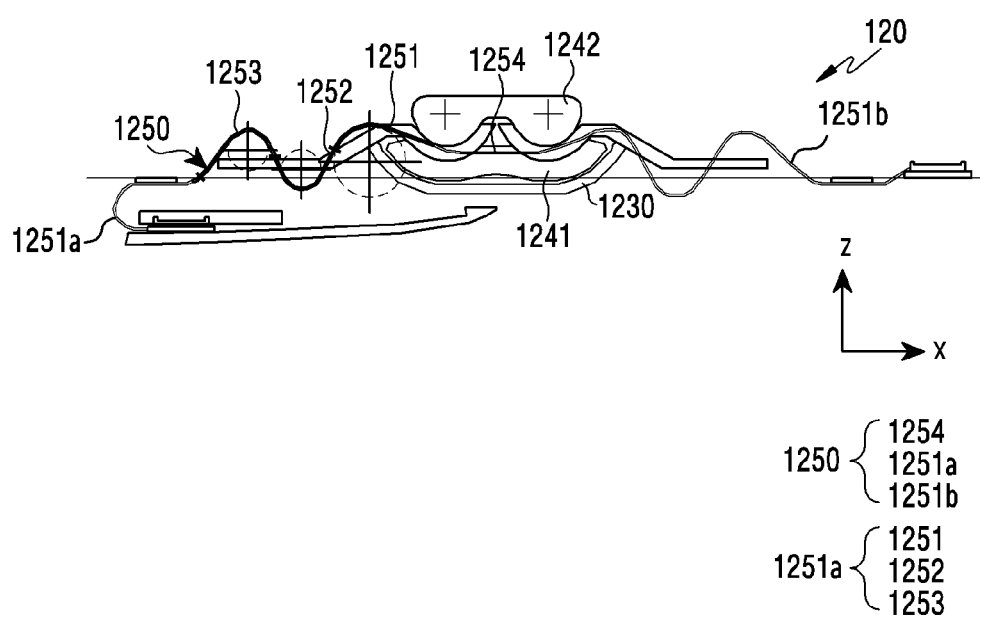
FIGS. 12A and 12B are cross-sectional views illustrating a flat state and a folded state of an electronic device including a flexible printed circuit board according to another embodiment, respectively.
Figure 12B:
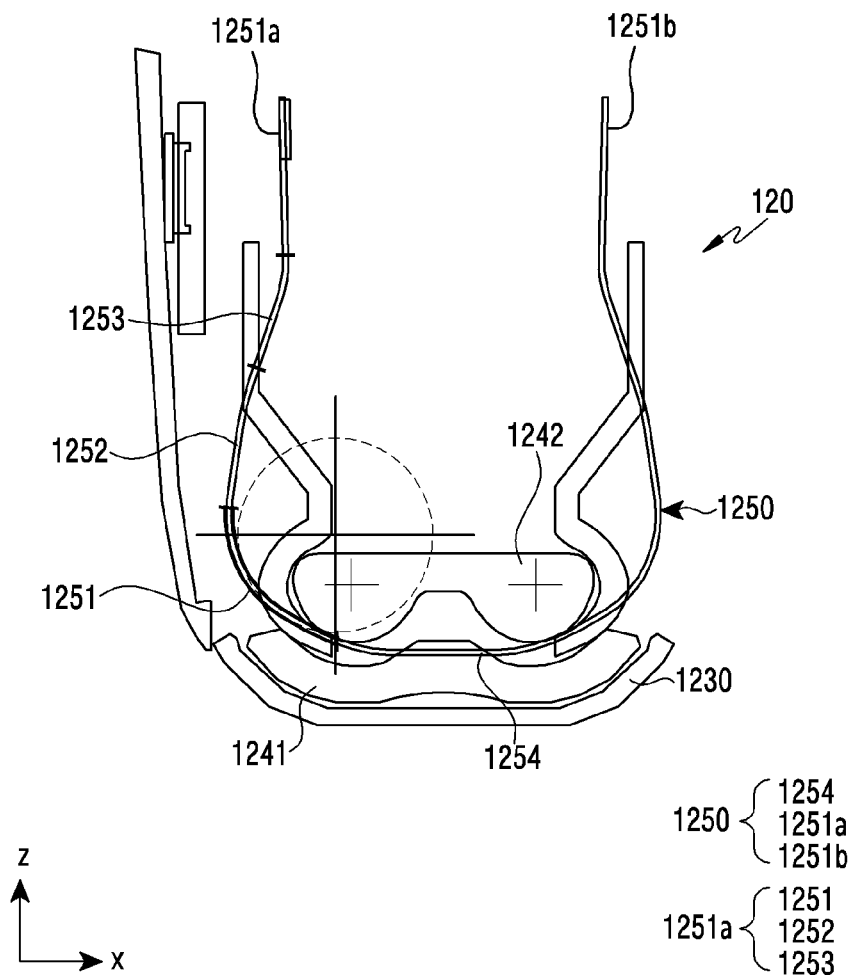

FIGS. 12A and 12B are cross-sectional views illustrating a flat state or a folded state of an electronic device 120 including a flexible printed circuit board 1250 according to another embodiment, respectively.

The electronic device 120 may be referred to by the electronic device 10 of FIGS. 1 to 3. Regarding components which are the same as or substantially the same as those described above, a redundant explanation will be omitted.

Referring to FIG. 12, the electronic device 120 may include a hinge housing 1230 including a hinge structure, a first hinge plate 1241 disposed in the hinge housing 1230, a second hinge plate 1242 disposed on an upper side of the first hinge plate 1241, and a flexible printed circuit board 1250 disposed between the first hinge plate 1241 and the second hinge plate 1242. However, the configuration of the electronic device 120 is not limited thereto. For example, the electronic device 120 may omit at least one component of the above-described components or may further include at least one other component. According to an embodiment, a shape of at least part of the flexible printed circuit board 1250 may be changed when the electronic device 120 is folded or unfolded.

According to an embodiment, the flexible printed circuit board 1250 may include a first section 1251, a second section 1252 extended from one side of the first section, and a third section 1253 extended from one side of the second section 1252. However, the configuration of the flexible printed circuit board 1250 is not limited thereto. For example, the flexible printed circuit board 1250 may omit at least one section of the above-described sections or may further include at least one other section. For example, the flexible printed circuit board 1250 may include a fourth section extended from the other side of the first section 1251.

According to an embodiment, the flexible printed circuit board 1250 may include the fourth section 1254, a first extension portion 1251*a* extended from one side of the fourth section 1254, and a second extension portion 1251*b* extended from the other side of the fourth section 1254. The first extension portion 1251*a* may include the first section 1251, the second section 1252, and the third section 1253. According to an embodiment, the first extension portion 1251*a* and the second extension portion 1251*b* may be symmetric with reference to the fourth section 1254. However, this should not be considered as limiting the invention.

According to an embodiment, the first section 1251 may have its shape changed when the electronic device 120 is folded or unfolded. For example, at least one of the first section 1251, the second section 1252, or the third section 1253 may be bent or unbent when the electronic device 120 is folded or unfolded.

According to an embodiment, the first section 1251 may include a curved shape which is formed seamlessly in the folded state (FIG. 12B) of the electronic device 120. In the folded state of the electronic device 120, at least part of the first section 1251 may be bent in a direction in which a housing of the electronic device 120 in the folded state faces (for example, +z axis direction). The first section 1251 may be bent in a direction in which the electronic device is unfolded (for example, a −x-axis direction) in the flat state (FIG. 12A) of the electronic device 120. According to an embodiment, in the flat state of the electronic device 120, the first section 1251 may include a curved surface which is convex in a direction in which the front surface of the electronic device faces (for example, a +z-axis direction).

According to an embodiment, at least part of the second section 1252 may be unbent in the folded state (FIG. 12B) of the electronic device 120. For example, in the folded state of the electronic device 120, the second section 1252 may include a linear area at least part of which is flat. At least part of the second section 1252 may be bent in the flat state (FIG. 12A) of the electronic device 120. For example, the second section 1252 may include a curved surface which is convex in a direction in which the rear surface of the electronic device faces (for example, a −z-axis direction). However, this should not be considered as limiting the invention.

According to an embodiment, at least part of the third section 1253 may be unbent in the folded state (FIG. 12B) of the electronic device 120. For example, in the folded state of the electronic device 120, the third section 1253 may include a linear area at least part of which is flat. At least part of the third section 1253 may be bent in the flat state (FIG. 12A) of the electronic device 120. For example, the third section 1253 may include a curved surface which is convex in the direction in which the front surface of the electronic device faces (for example, the +z-axis direction). However, this should not be considered as limiting the invention.

According to an embodiment, when the electronic device 40 is folded, a variance in the curvature of the first section 1251 may be greater than a variance in the curvature of the second section 1252 or the third section 1253. In another embodiment, when a first housing (for example, the first housing 410 of FIG. 4) and a second housing (for example, the second housing 420 of FIG. 4) rotate through a hinge structure, a variance in the curvature of the first section 1251 may be greater than a variance in the curvature of the second section 1252 or the third section 1253.

According to an embodiment, a width of the first section 1251 of the flexible printed circuit board 1250 may be larger than a width of the second section 1252 or the third section 1253. A length of the first section 1251 of the flexible printed circuit board 1250 in a rotation axis direction (for example, a y-axis direction) of the hinge structure may be longer than a length of the second section 1252 or the third section 1253. Accordingly, a repulsive force of the first section 1251 generated by elasticity according to bending of the flexible printed circuit board 1250 may be greater than a repulsive force of the second section 1252 or the third section 1253. Since the width of the first section 1251 is larger than the width of the second section 1252 or the third section 1253, a stress of the first section 1251 may be greater than a stress of the second section 1252 or the third section 1253. Due to the difference in the stress between the first section 1251 and the second section 1252 or the third section 1253, the flexible printed circuit board 1250 may be bent with the curvature of the first section 1251 being smaller than the curvature of the second section 1252 or the third section 1253 when the electronic device is unfolded and the flexible printed circuit board 1250 is bent. Accordingly, the first section 1251 the curvature of which is changed more greatly than the second section 1252 or the third section 1253 according to bending of the flexible printed circuit board may be effectively prevented from being damaged.

According to an embodiment, the width of the first section 1251 of the flexible printed circuit board 1250 may be larger than each of the width of the second section 1252 and the third section 1253. A length of the first section 1251 of the flexible printed circuit board 1250 in a longitudinal direction (for example, an x-axis direction) of the flexible printed circuit board 1250 may be longer than a length of each of the second section 1252 and the third section 1253. Accordingly, a repulsive force of the first section 1251 generated by elasticity according to bending of the flexible printed circuit board 1250 may be greater than a repulsive force of each of the second section 1252 and the third section 1253. Since the width of the first section 1251 is larger than the width of the second section 1252 or the width of the third section 1253, a stress of the first section 1251 may be greater than a stress of the second section 1252 or the third section 1253. Due to the difference in the stress between the first section 1251 and the second section 1252 or the third section 1253, the flexible printed circuit board 1250 may be bent with the curvature of the first section 1251 being smaller than the curvature of the second section 1252 or the third section 1253 when the electronic device is unfolded and the flexible printed circuit board 1250 is bent. Accordingly, the first section 1251 the curvature of which is changed more greatly than the second section 1252 or the third section 1253 according to bending of the flexible printed circuit board 1250 may be effectively prevented from being damaged.

According to an embodiment, a thickness of the first section 1251 of the flexible printed circuit board 1250 may be thicker than a thickness of each of the second section 1252 and the third section 1253. Accordingly, a repulsive force of the first section 1251 generated by elasticity according to bending of the flexible printed circuit board 1250 may be greater than a repulsive force of each of the second section 1252 and the third section 1253. Since the first section 1251 is less bent than the second section 1252 or the third section 1253 due to the greater repulsive force, the curvature of the first section 1251 which is bent in the flat state of the electronic device 120 may be smaller than the curvature of the second section 1252 or the third section 1253. The thickness of the first section 1251 may be thicker than the thickness of each of the second section 1252 and the third section 1253, such that a variance in the curvature of the first section 1251 caused by folding and unfolding of the electronic device 120 is reduced. Accordingly, the first section 1251 the curvature of which is changed more greatly than the second section 1252 or the third section 1253 according to bending of the flexible printed circuit board may be effectively prevented from being damaged.

According to an embodiment, the flexible printed circuit board 1250 may further include at least one of at least one stiffener or at least one coating layer than the second section 1252 or the third section 1253. Accordingly, the thickness of the first section 1251 may be thicker than the thickness of the second section 1252 or the third section 1253. The first section 1251 further includes at least one of a stiffener or a coating layer than the second section 1252 or the third section 1253, such that a repulsive force of the first section 1251 generated by elasticity according to bending of the flexible printed circuit board 1250 is greater than a repulsive force of the second section 1252 or the third section 1253. Since the first section 1251 is less bent than the second section 1252 or the third section 1253 due to the greater repulsive force, the curvature of the first section 1251 which is bent in the flat state of the electronic device 120 may be smaller than the curvature of the second section 1252 or the third section 1253. Accordingly, the first section 1251 the curvature of which is changed more greatly than the second section 1252 or the third section 1253 according to bending of the flexible printed circuit board may be effectively prevented from being damaged.

As described above, an electronic device may include: a hinge structure, which is a folding area and includes a hinge housing; a first housing connected to the hinge structure; a second housing connected with the first housing through the hinge structure to be rotatable with respect to the first housing; and a flexible printed circuit board (FPCB), which has a first end connected to a first printed circuit board (PCB) disposed in the first housing, and a second end connected to a second PCB disposed in the second housing. The FPCB may include a first section and a second section, and the second section may be extended from a first side of the first section, and a variance in a curvature of the second section may be greater than a variance in a curvature of the first section when the first housing and the second housing rotate with respect to the hinge structure, and a repulsive force of the second section generated by elasticity according to folding of the second section may be greater than a repulsive force of the first section.

According to an embodiment, a length of the second section of the FPCB in a rotation axial direction of the hinge structure may be longer than a length of the first section in the rotation axial direction.

According to an embodiment, a length of the second section of the FPCB in a direction along a surface of the FPCB from the one end connected with the first PCB to the second end connected with the second PCB is longer than a length of the first section in the same direction.

According to an embodiment, a thickness of the second section of the FPCB may be thicker than a thickness of the first section.

According to an embodiment, the second section of the FPCB may further include at least one of a stiffener or a coating layer than the first section, and the stiffener may include at least one high-polymer layer.

According to an embodiment, the FPCB may further include a third section which is extended from a second side of the first section, and includes a linear area at least part of which has a flat surface, where the second side of the first section is opposite the first side.

According to an embodiment, the third section of the FPCB may further include at least one of a stiffener or a coating layer than the first section or the second section, and the stiffener may include at least one high-polymer layer.

According to an embodiment, a thickness of the third section of the FPCB may be thicker than a thickness of at least one of the first section or the second section.

According to an embodiment, a length of the third section of the FPCB in a rotation axial direction of the hinge structure may be longer than a length of each of the first section and the second section in the rotation axial direction.

According to an embodiment, the electronic device may further include a first hinge plate disposed in the first housing and a second hinge plate disposed in the second housing, and the FPCB may further include at least one fixing area which is disposed on one side of the second section and is fixed to the first hinge plate or the second hinge plate.

According to an embodiment, the FPCB may further include at least one of a stiffener or a coating layer between the first section and the fixing area, and the stiffener may include at least one high-polymer layer.

As described above, an electronic device according to an embodiment may include: a hinge structure, which is a folding area and includes a hinge housing; a first housing connected to the hinge structure; a second housing connected with the first housing through the hinge structure to be rotatable with respect to the first housing; and an FPCB, which has a first end connected to a first PCB disposed in the first housing, and a second end connected to a second PCB disposed in the second housing, and the FPCB may include: a first section including a curvature when the first housing and the second housing are folded or unfolded through the hinge structure; and a second section, which is extended from a first side of the first section, and is disposed to form a linear area at least part of which has a flat surface in the folded state of the first housing and the second housing, and to form a curvature in the unfolded state, a variance in a curvature of the second section may be greater than a variance in a curvature of the first section when the first housing and the second housing rotate with respect to the hinge structure, and a repulsive force of the second section generated by elasticity according to folding of the second section may be greater than a repulsive force of the first section.

According to an embodiment, a length of the second section of the FPCB in a rotation axial direction of the hinge structure may be longer than a length of the first section in the rotation axial direction.

According to an embodiment, a length of the second section of the FPCB in a direction along a surface of the FPCB from the first end connected with the first PCB to the second end connected with the second PCB may be longer than a length of the first section in the same direction.

According to an embodiment, a thickness of the second section of the FPCB may be thicker than a thickness of the first section.

According to an embodiment, the second section of the FPCB may further include at least one of a stiffener or a coating layer than the first section, and the stiffener may include at least one high-polymer layer.

According to an embodiment, the FPCB may further include a third section which is extended from a second side of the first section, and includes a linear area at least part of which has a flat surface, where the second side of the first section is opposite the first side.

According to an embodiment, the third section of the FPCB may further include at least one of a stiffener or a coating layer than the first section or the second section, and the stiffener may include at least one high-polymer layer.

According to an embodiment, a thickness of the third section of the FPCB may be thicker than a thickness of at least one of the first section or the second section.

As described above, an electronic device according to an embodiment may include: a hinge structure which is a folding area and includes a hinge housing; a first housing connected to the hinge structure; a second housing connected with the first housing through the hinge structure to be rotatable with respect to the first housing; and an FPCB, which has a first end connected to a first PCB disposed in the first housing, and a second end connected to a second PCB disposed in the second housing, and the FPCB may include a first section, a second section, and a third section, the second section is extended from one side of the first section, and the third section is extended from one side of the second section and is disposed, a variance in a curvature of the first section is greater than a variance in a curvature of at least one of the second section or the third section when the first housing and the second housing rotate with respect to the hinge structure, and a repulsive force of the first section generated by elasticity according to folding of the first section may be greater than a repulsive force of at least one of the second section or the third section.

What is claimed is:
1. An electronic device comprising:
   a first housing;
   a second housing;
   a hinge structure rotatably connecting the first housing and the second housing; and
   a flexible printed circuit board (FPCB), which has a first end connected to a first printed circuit board (PCB) disposed in the first housing, and a second end connected to a second PCB disposed in the second housing,
   wherein the FPCB comprises a first section and a second section, and the second section is extended from a first side of the first section,
   wherein a variance in a curvature of the second section is greater than a variance in a curvature of the first section when the first housing and the second housing rotate with respect to the hinge structure,
   wherein the first section and the second section are configured such that a repulsive force of the second section generated by elasticity according to bending of the FPCB is greater than a repulsive force of the first section.
2. The electronic device of claim 1, wherein a length of the second section of the FPCB in a rotation axial direction of the hinge structure is longer than a length of the first section in the rotation axial direction.
3. The electronic device of claim 1, wherein a length of the second section of the FPCB in a direction along a surface of the FPCB from the first end connected with the first PCB to the second end connected with the second PCB is longer than a length of the first section in a same direction.
4. The electronic device of claim 1, wherein a thickness of the second section of the FPCB is thicker than a thickness of the first section.
5. The electronic device of claim 1, wherein the second section of the FPCB further comprises at least one of a stiffener or a coating layer than the first section, and
   wherein the stiffener comprises at least one high-polymer layer.
6. The electronic device of claim 1, wherein the FPCB further comprises a third section, which is extended from a second side of the first section, and comprises a linear area at least part of which has a flat surface,
- wherein the second side of the first section is opposite the first side.

7. The electronic device of claim 6, wherein the third section of the FPCB further comprises at least one of a stiffener or a coating layer than the first section or the second section, and
- wherein the stiffener comprises at least one high-polymer layer.

8. The electronic device of claim 6, wherein a thickness of the third section of the FPCB is thicker than a thickness of at least one of the first section or the second section.

9. The electronic device of claim 6, wherein a length of the third section of the FPCB in a rotation axial direction of the hinge structure is longer than a length of each of the first section and the second section in the rotation axial direction.

10. The electronic device of claim 1, further comprising:
- a first hinge plate disposed in the first housing and a second hinge plate disposed in the second housing,
- wherein the FPCB further comprises at least one fixing area which is disposed on one side of the second section and is fixed to the first hinge plate or the second hinge plate.

11. The electronic device of claim 10, wherein the FPCB further comprises at least one of a stiffener or a coating layer between the first section and the fixing area, and
- wherein the stiffener comprises at least one high-polymer layer.

12. An electronic device comprising:
- a first housing;
- a second housing;
- a hinge structure rotatably connecting the first housing and the second housing; and
- an FPCB, which has a first end connected to a first PCB disposed in the first housing, and a second end connected to a second PCB disposed in the second housing,
- wherein the FPCB comprises:
  - a first section comprising a curvature when the first housing and the second housing are folded or unfolded through the hinge structure; and
  - a second section, which is extended from a first side of the first section, and is disposed to form a linear area at least part of which has a flat surface in the folded state of the first housing and the second housing, and to form a curvature in the unfolded state,
- wherein a variance in a curvature of the second section is greater than a variance in a curvature of the first section when the first housing and the second housing rotate with respect to the hinge structure,
- wherein the first section and the second section are configured such that a repulsive force of the second section generated by elasticity according to bending of the FPCB is greater than a repulsive force of the first section.

13. The electronic device of claim 12, wherein a length of the second section of the FPCB in a rotation axial direction of the hinge structure is longer than a length of the first section in the rotation axial direction.

14. The electronic device of claim 12, wherein a length of the second section of the FPCB in a direction along a surface of the FPCB from the first end connected with the first PCB to the second end connected with the second PCB is longer than a length of the first section in a same direction.

15. The electronic device of claim 12, wherein a thickness of the second section of the FPCB is thicker than a thickness of the first section.

16. The electronic device of claim 12, wherein the second section of the FPCB further comprises at least one of a stiffener or a coating layer than the first section, and
- wherein the stiffener comprises at least one high-polymer layer.

17. The electronic device of claim 12, wherein the FPCB further comprises a third section which is extended from a second side of the first section, and comprises a linear area at least part of which has a flat surface,
- wherein the second side of the first section is opposite the first side.

18. The electronic device of claim 17, wherein a thickness of the third section of the FPCB is thicker than a thickness of at least one of the first section or the second section.

19. The electronic device of claim 17, wherein a length of the third section of the FPCB in a rotation axial direction of the hinge structure is longer than a length of each of the first section and the second section in the rotation axial direction.

20. An electronic device comprising:
- a first housing;
- a second housing;
- a hinge structure rotatably connecting the first housing and the second housing; and
- an FPCB, which has a first end connected to a first PCB disposed in the first housing, and a second end connected to a second PCB disposed in the second housing,
- wherein the FPCB comprises a first section, a second section, and a third section, the second section is extended from one side of the first section, and the third section is extended from one side of the second section,
- wherein a variance in a curvature of the first section is greater than a variance in a curvature of at least one of the second section or the third section when the first housing and the second housing rotate with respect to the hinge structure,
- wherein the first section and the second section are configured such that a repulsive force of the first section generated by elasticity according to bending of the FPCB is greater than a repulsive force of the second section.

* * * * *